US008884697B2

(12) United States Patent
Hongo

(10) Patent No.: US 8,884,697 B2

(45) Date of Patent: Nov. 11, 2014

(54) AMPLIFYING DEVICE

(75) Inventor: Naoki Hongo, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 45 days.

(21) Appl. No.: 13/809,663

(22) PCT Filed: Jul. 12, 2011

(86) PCT No.: PCT/JP2011/003988
§ 371 (c)(1),
(2), (4) Date: Jan. 11, 2013

(87) PCT Pub. No.: WO2012/014395
PCT Pub. Date: Feb. 2, 2012

(65) Prior Publication Data

US 2013/0113557 A1 May 9, 2013

(30) Foreign Application Priority Data

Jul. 27, 2010 (JP) ................................ 2010-168024

(51) Int. Cl.
*H03G 3/20* (2006.01)
*H03F 1/02* (2006.01)
*H03F 3/189* (2006.01)
*H03F 3/24* (2006.01)

(52) U.S. Cl.
CPC ............ *H03F 3/24* (2013.01); *H03F 2200/504* (2013.01); *H03F 1/0222* (2013.01); *H03F 2200/336* (2013.01); *H03F 3/189* (2013.01)
USPC .......................................... 330/136; 330/296

(58) Field of Classification Search
CPC ........................................................ H03G 3/20
USPC ................................. 330/136, 129, 285, 296
See application file for complete search history.

(56) References Cited

U.S. PATENT DOCUMENTS 7,420,415 B2 * 9/2008 Lee et al. ...................... 330/136
7,554,396 B2 * 6/2009 Kim ............................. 330/136

(Continued)

FOREIGN PATENT DOCUMENTS

JP 2689011 12/1997
JP 2006-148781 6/2006
JP 2008-271172 11/2008

(Continued)

OTHER PUBLICATIONS

International Search Report issued Aug. 16, 2011 in International (PCT) Application No. PCT/JP2011/003988.
English translation of Notification of Reasons for Refusal dated Sep. 17, 2013 in corresponding Japanese Patent Application No. 2012-526284.

*Primary Examiner* — Henry Choe
(74) *Attorney, Agent, or Firm* — Wenderoth, Lind & Ponack, L.L.P.

(57) ABSTRACT

An efficient amplifying device is achieved. An amplifying device that amplifies a signal subject to amplification is configured as follows. That is, an amplifier (PA 5) that amplifies a signal is provided. Level control means 1 converts a level of the signal subject to amplification according to the level of this signal. Power supply control means 6 and 8 supply the amplifier (PA 5) with a power supply voltage determined according to the level of the signal subject to amplification. The amplifier (PA 5) amplifies a signal at the level converted by the level control means 1 with the power supply voltage supplied from the power supply control means 6 and 8.

6 Claims, 12 Drawing Sheets

(56) References Cited

U.S. PATENT DOCUMENTS

| | | | | |
|---|---|---|---|---|
| 7,808,313 | B2 * | 10/2010 | Markowski et al. | 330/136 |
| 8,004,357 | B2 * | 8/2011 | Lee et al. | 330/136 |
| 8,154,341 | B2 * | 4/2012 | Ishikawa et al. | 330/136 |
| 2009/0081968 | A1 | 3/2009 | Vinayak et al. | |
| 2010/0019840 | A1 | 1/2010 | Takahashi | |
| 2010/0311365 | A1 | 12/2010 | Vinayak et al. | |

FOREIGN PATENT DOCUMENTS

| | | |
|---|---|---|
| WO | 2008/072700 | 6/2008 |
| WO | 2008/090721 | 7/2008 |
| WO | 2009/038975 | 3/2009 |

* cited by examiner

AMPLIFYING DEVICE

This application is a 371 of PCT/JP2011/003988 Jul. 12, 2011

TECHNICAL FIELD

The present invention relates to an amplifying device, and more particularly, to an efficient amplifying device.

BACKGROUND ART

Lower nonlinear distortion, higher efficiency, and a wider bandwidth are required for a power amplifier. Presently, it is normal to increase efficiency with a Doherty amplifier and to perform distortion compensation by DPD (Digital Pre-Distortion).

For example, cell phones of 3G and later models use signals with a high PAPR (Peak to Average Power ratio), such as WCDMA (Wideband Code Division Multiple Access) signals and OFDM (Orthogonal Frequency Division Multiplex) signals, and a bandwidth of the system is tens of MHz. Signals in a further wider bandwidth are used for 4G models. However, a Doherty amplifier requires back-off corresponding to a PAPR and there is a limit to an increase of efficiency. Also, because load modulation using a quarter-wave line is performed, it is difficult to widen the bandwidth.

Given these circumstances, a study is now being conducted for a method of operating an amplifier always in a near-saturated condition by controlling a power supply voltage of the amplifier according to an amplitude of a signal to be amplified. When this method is used, high efficiency is achieved because, ideally, there is no need of back-off. Also, because this method is independent of a frequency of a signal to be amplified, it is expected to widen the bandwidth. Examples of representative technique of this method include but not limited to the ET (Envelope Tracking) method and the EER (Envelope Elimination and Restoration) method.

FIG. 9 conceptually shows a configuration example of an amplifying device using the ET method.

An amplifying device of this example includes a PA (Power Amplifier) 101, an amplitude detection portion 102, and a PA power supply portion 103.

An input signal is an RF (Radio Frequency) signal that is a modulated signal having a high PAPR, such as a CDMA signal and an OFDM signal, superimposed on an RF carrier wave.

An example of an operation performed in this amplifying device using the ET method will be described.

An amplitude of an input signal is detected in the amplitude detection portion 102. The PA power supply portion 103 controls magnitude of a power supply voltage to be given to the PA 101 according to magnitude of the detected amplitude. Upon input of the input signal, the PA 101 amplifies power and outputs an output signal.

In this instance, the operation is timed by inserting a delay circuit (not shown) on an input side or a power supply side of the PA 101 as the need arises so that the PA 101 supplies power supply corresponding to the amplitude of the input signal.

As an example to achieve this amplifying device, a diode detector is used as the amplitude detection portion 102, a class D amplifier is used as the PA power supply portion 103, and an FET (Field Effect Transistor) or a bipolar transistor is used as the PA 101. Besides this example, the amplifying device can be achieved using various known techniques.

FIG. 10 conceptually shows a configuration example of an amplifying device using the EER method.

This amplifying device includes a power amplification portion (PA) 101, an amplitude detection portion 102, a PA power supply portion 103, and a phase detection portion (for example, a limiter) 111.

Herein, a schematic difference from the amplifying device using the ET method shown in FIG. 9 is that the phase detection portion 111 is provided on an input side of the PA 101.

An example of an operation performed in this amplifying device using the EER method will now be described.

The phase detection portion 111 removes amplitude information of an input signal and extracts phase information alone that is outputted to the PA 101. This example utilizes a property that a gain of the PA 101 varies with a voltage applied from the PA power supply portion 103 and the amplitude information is restored in an output signal from the PA 101.

As an example to achieve this amplifying device, a saturated amplifier is used as the phase detection portion 111. Also, because an input signal is a regular envelope signal herein, a class C amplifier can be used as the PA 101. Besides this example, the amplifying device can be achieved using various known techniques.

FIG. 11 shows comparative examples to compare a conventional method (fixed voltage) with the ET method and the EER method.

The abscissa of the graph represents a time (Time) and the ordinate represents a drain voltage (VDD) applied to the FET by way of example.

In the conventional method, a fixed power supply voltage (Fixed VDD) matched with the maximum power is applied to the FET. On the contrary, in the ET method and the EER method, a power supply voltage corresponding to the amplitude (Envelope indicated by a dotted line) of an input signal is applied to the FET so that the amplifier (PA) operates in a near-saturated condition. Hence, a supply voltage can be reduced by a shaded portion shown in FIG. 11. In short, because a supply of power to the PA 101 can be reduced, efficiency is increased.

Herein, examples using the ET method and the EER method above have described a method of achieving the amplifying device for analog signals.

A method of achieving an amplifying device for digital signals will now be described.

FIG. 12 conceptually shows a configuration example of an amplifying device adopting a digital method and using the ET method or the EER method.

This amplifying device includes a phase detection portion (for example, a limiter) 121 that is not provided in the ET method and provided in the EER method, a D-to-A (Digital to Analog) converter 122, another D-to-A converter 123, a quadrature modulation portion 124, a power amplification portion (PA) 125, an amplitude detection portion 126, a still another D-to-A converter 127, and a PA power supply portion 128.

Herein, functions furnished to the power amplification portion (PA) 125, the amplitude detection portion 126, the PA power supply portion 128, and the phase detection portion 121 are the same as those in the cases for the analog method shown in FIG. 9 and FIG. 10. A difference from the analog method shown in FIG. 9 and FIG. 10 is that the D-to-A converters 122, 123, and 127 and the quadrature modulation portion 124 are provided.

An example of an operation performed in this amplifying device will be described.

An input signal includes digital signals I(t) and Q(t) of an I-phase and a Q-phase, respectively.

The amplitude detection portion 126 is provided to a digital portion and finds an instantaneous amplitude Env(t) in accordance with (Equation 1) below and outputs the result. Herein, Env(t), I(t), and Q(t) are functions of a time t.

[Formula 1]

$$Env(t)=\sqrt{I^2(t)+Q^2(t)} \quad \text{(Equation 1)}$$

An output signal from the amplitude detection portion 126 in the form of a digital signal is converted to an analog signal in the D-to-A converter 127. The PA power supply portion 128 is the same as the counterpart of the analog method.

Also, in the case of the EER method, input signals are inputted into the D-to-A converters 122 and 123 after they are sent to the phase detection portion 121. In the case of the ET method, the phase detection portion 121 is omitted and input signals are inputted into the D-to-A converters 122 and 123.

The phase detection portion 121 finds an instantaneous phase θ(t) in accordance with (Equation 2) below and outputs a signal I'(t) expressed by (Equation 3) below to the D-to-A converter 122 and a signal Q' (t) expressed by (Equation 4) below to the D-to-A converter 123. Herein, θ(t), I(t), Q(t), I'(t), and Q'(t) are functions of a time (t) and $A_{FIX}$ is a fixed amplitude.

[Formula 2]

$$\theta(t)=\tan^{-1}(Q(t)/I(t)) \quad \text{(Equation 2)}$$

[Formula 3]

$$I'(t)=A_{FIX}\cdot\cos(\theta(t)) \quad \text{(Equation 3)}$$

[Formula 4]

$$Q'(t)=A_{FIX}\cdot\sin(\theta(t)) \quad \text{(Equation 4)}$$

In the case of the ET method, each of the D-to-A converter 122 corresponding to the I-phase and the D-to-A converter 123 corresponding to the Q-phase converts an input signal in the form of a digital signal to an analog signal and outputs the resulting signal to the quadrature modulation portion 124. In the case of the EER method, each converts an output signal from the phase detection portion 121 in the form of a digital signal to an analog signal and outputs the resulting signal to the quadrature modulation portion 124.

The quadrature modulation portion 124 applies quadrature modulation to signals from the D-to-A converters 122 and 123 and outputs the resulting signal to the PA 125. The PA 125 amplifies power of the signal from the quadrature modulation portion 124.

A frequency converter (up converter) is normally provided between the quadrature modulation portion 124 and the PA 125 depending on a radio frequency. However, this frequency converter is not shown in FIG. 12.

CITATION LIST

Patent Documents

Patent Document 1: JP-A-2004-104194
Patent Document 2: JP-A-2009-159218

SUMMARY OF INVENTION

Technical Problem

An example of ideal characteristics of an amplifier will now be described.

FIGS. 13(*a*) and 13(*b*) show characteristics of an ET amplifier (PA herein). FIG. 13(*a*) shows an example of a gain characteristic and FIG. 13(*b*) shows an example of an input-to-output characteristic.

In the graph of the gain characteristic, the abscissa represents input power (or input amplitude) Pin [dB] of the amplifier and the ordinate represents a gain (Gain) [dB].

In the graph of the input-to-output characteristic, the abscissa represents input power (or input amplitude) Pin [dB] of the amplifier and the ordinate represents output power (or output amplitude) Pout [dB] of the amplifier.

Also, the gain characteristic and the input-to-output characteristic show a plurality of characteristics in a case where a power supply voltage VDD of the amplifier is varied from a maximum value $VDD_{MAX}$ to a minimum value $VDD_{MIN}$ (where $VDD_{MAX}>VDD_{MIN}$).

For example, a characteristic such that links circled points in the drawings is ideal for the gain characteristic and the input-to-output characteristic. In other words, it is preferable to use as low a voltage as possible as the power supply voltage and to use the amplifier immediately before saturation.

FIGS. 13(*c*) and 13(*d*) show characteristics of an EER amplifier (herein, PA). FIG. 13(*c*) shows an example of a gain characteristic and FIG. 13(*d*) shows an example of an input-to-output characteristic.

In the graph of the gain characteristic, the abscissa represents input power (or input amplitude) Pin [dB] of the amplifier and the ordinate represents a gain (Gain) [dB].

In the graph of the input-to-output characteristic, the abscissa represents input power (or input amplitude) Pin [dB] of the amplifier and the ordinate represents output power (or output amplitude) Pout [dB] of the amplifier.

Also, the gain characteristic and the input-to-output characteristic show a plurality of characteristics in a case where a power supply voltage VDD of the amplifier is varied from a maximum value $VDD_{MAX}$ to a minimum value $VDD_{MIN}$ (where $VDD_{MAX}>VDD_{MIN}$).

For example, a characteristic such that links circled points in the drawings is ideal for the gain characteristic and the input-to-output characteristic. In other words, it is preferable to use as low a voltage as possible as the power supply voltage and to use the amplifier immediately before saturation.

FIGS. 14(*a*), 14(*b*), and 14(*c*) show characteristics of a typical amplifier. FIG. 14(*a*) shows an example of a gain characteristic. FIG. 14(*b*) shows an example of an input-to-output characteristic. FIG. 14(*c*) shows an example of power efficiency characteristic.

In the graph of the gain characteristic, the abscissa represents input power (or input amplitude) Pin [dB] of the amplifier and the ordinate represents a gain (Gain) [dB].

In the graph of the input-to-output characteristic, the abscissa represents input power (or input amplitude) Pin [dB] of the amplifier and the ordinate represents output power (or output amplitude) Pout [dB] of the amplifier.

In the graph of the power efficiency characteristic, the abscissa represents input power (or input amplitude) Pin [dB] of the amplifier and the ordinate represents power efficiency η.

Also, the gain characteristic, the input-to-output characteristic, and the power efficiency characteristic show a plurality of characteristics in a case where a power supply voltage VDD of the amplifier is varied from a maximum value $VDD_{MAX}$ to a minimum value $VDD_{MIN}$ (where $VDD_{MAX}>VDD_{MIN}$).

As are shown in FIGS. 14(*a*), 14(*b*), and 14(*c*), according to the ET method and the EER method, the characteristics go along trajectories indicated by a dotted line with respect to power (amplitude) of an input signal into the amplifier (for example, the PA 101 or 125).

Herein, as can be understood from FIGS. 14(*a*) and 14(*b*), there is a characteristic that a gain is maintained substantially constant with a variance of the power supply voltage VDD in a region where the power supply voltage VDD is high whereas the gain varies with a variance of the power supply voltage VDD as the power supply voltage VDD becomes lower. This characteristic raises a problem that it is difficult to adjust the amplifier to the characteristics found by the ET method and the EER method.

Also, in a region where the power supply voltage VDD is low, the gain varies considerably with a variance of the power supply voltage VDD and the power efficiency $\eta$ becomes extremely low. Hence, because the amplifier becomes unstable, it is preferable not to use the amplifier in such a region.

Also, as can be understood from FIG. 14(*c*), neither the ET method nor the EER method shows the characteristic in which the power efficiency $\eta$ reaches a maximum. Hence, both methods still have a problem for optimization.

The invention is devised under the circumstances in the related art described above and has an object to provide an efficient amplifying device.

Solution to Problem

In order to achieve the object above, the invention provides configuration as follows for an amplifying device that amplifies a signal subject to amplification.

That is, the amplifying device includes an amplifier that amplifies a signal. A level control means converts a level of the signal subject to amplification according to the level of this signal. A power supply control means supplies the amplifier with a power supply voltage determined according to the level of the signal subject to amplification. The amplifier amplifies the signal at the level converted by the level control means with the power supply voltage supplied from the power supply control means.

It thus becomes possible to achieve an efficient amplifying device.

Various signals are used as a signal subject to amplification. For example, in a case where the invention is applied to a transmitter, a signal to be transmitted can be used.

Also, various types of amplifier can be used. For example, a power amplifier can be used. Also, the amplifying device can be formed, for example, as a power amplifying device.

Further, as the level of a signal, for example, a level of amplitude and a level of power can be used.

In a configuration to convert a level of a signal subject to amplification according to the level of this signal and a configuration to determine a power supply voltage according to a level of the signal subject to amplification, a reference is not necessarily made to the level itself of a signal subject to amplification. For example, a reference may be made to information acquired on the basis of the level of a signal subject to application.

As a configuration example, the power supply control means supplies the amplifier with a power supply voltage determined according to a level of a signal at the level converted by the level control means.

As a configuration example, the amplifying device of the invention is configured as follows.

That is, the level control means stores information set so that a gain of the amplifying device remains constant independently of a level of the signal subject to amplification as information that regulates a manner in which to convert a level of the signal subject to amplification according to the level of this signal.

Also, the power supply control means stores information set so that power efficiency of the amplifier reaches a maximum for a level of the signal subject to amplification as information that regulates a manner in which to determine a power supply voltage according to a level of the signal subject to amplification.

Hence, because it becomes possible to make a gain of the amplifying device constant and maximize power efficiency of the amplifier, efficiency can be increased.

As the information that regulates a manner in which to convert a level of the signal subject to amplification according to the level of this signal, for example, information on mapping of a level of the signal subject to amplification to a value used when the level of this signal is converted (for example, an amplitude converting value shown in FIG. 3) can be used. Such information can be provided in the form of a table or a mathematical formula.

Also, as the information that regulates a manner in which to determine a power supply voltage according to a level of the signal subject to amplification, for example, information on mapping of a level of the signal subject to amplification (this can be a level after level conversion) to a value used when the power supply voltage is controlled (for example, a power supply control value shown in FIG. 4) can be used. Such information can be provided in the form of a table or a mathematical formula.

As another configuration example, the amplifying device of the invention is configured as follows.

That is, a gain detection means detects a gain of the amplifying device on the basis of the signal subject to amplification and a signal outputted from the amplifier. An update means updates either one or both of a manner in which to convert a level of the signal subject to amplification according to the level of this signal by the level control means and a manner in which to determine a power supply voltage according to a level of the signal subject to amplification by the power supply control means, according to the gain detected by the gain detection means.

It thus becomes possible to maintain a satisfactory condition by making an update to the level control means and the power supply control means using a feedback signal (signal outputted from the amplifier).

In the configuration in which a gain of the amplifying device is detected on the basis of the signal subject to amplification and the signal outputted from the amplifier, the signal subject to amplification and the signal outputted from the amplifier are not necessarily used intact. For example, signals obtained on the basis of the signals, such as signals obtained as the result of applying processing to these signals, may be used.

Also, either one or both of the update in the level control means and the update in the power supply control means may be performed.

(The following will describe configuration examples.)

Hereinafter, as configuration examples, (configuration example 1) through (configuration example 10) will be described. It should be appreciated, however, that these configuration examples have no intention to limit the invention.

Configuration Example 1

Corresponding, for Example, to FIG. 1 and FIG. 5

A power amplifying device characterized by including:

an amplitude control unit that converts an amplitude of an input signal by mapping the amplitude to the amplitude of this input signal; and a power supply control unit that controls a power supply voltage of a power amplifier by mapping the power supply voltage to the converted amplitude (in a case where the power supply voltage is mapped to the amplitude of the input signal as another configuration example, the configuration example corresponds to FIG. 7).

Configuration Example 2

Corresponding, for Example, to FIG. 3

A power amplifier device that is the power amplifying device described in (configuration example 1) above and characterized in that:

the mapping by which to convert the amplitude in the amplitude control unit establishes a relation with which the amplitude is converted so that a gain of the power amplifying device remains constant independently of the amplitude of the input signal.

Configuration Example 3

Corresponding, for Example, to FIG. 4

A power amplifying device that is the power amplifying device described in (configuration example 1) or (configuration example 2) above and characterized in that:

the mapping by which to control a power supply voltage in the power supply control unit establishes a relation with which a power supply voltage is controlled to maximize power efficiency of the power amplifier for the amplitude of the input signal.

Configuration Example 4

Corresponding, for Example, to FIG. 5

A power amplifying device that is the power amplifying device described in any one of (configuration example 1) through (configuration example 3) above and characterized in that the amplitude control unit includes:

an amplitude detection portion that detects an amplitude of an input signal;

an amplitude control portion that outputs an amplitude converting value corresponding to the detected amplitude; and an amplitude conversion portion that converts the amplitude of the input signal according to the amplitude converting value.

Configuration Example 5

Corresponding, for Example, to FIG. 5

A power amplifying device that is the power amplifying device described in any one of (configuration example 1) through (configuration example 3) above and characterized in that the power supply control unit includes:

an amplitude detection portion that detects an amplitude of an input signal; and a power supply control portion that outputs a power supply control value corresponding to the detected amplitude.

Configuration Example 6

Corresponding, for Example, to FIG. 1, FIG. 5, and FIG. 7

A power amplifying device that is the power amplifying device described in any one of (configuration example 1) through (configuration example 5) and characterized by further including:

a device control unit that adaptively controls at least one of the mapping in the amplitude control unit and the mapping in the power supply control unit.

Configuration Example 7

Corresponding, for Example, to FIG. 5 and FIG. 7

A power amplifying device that is the amplifying device described in (configuration example 6) above and characterized in that the device control unit includes:

an A-to-D (Analog to Digital) converter that converts a feedback signal from the amplifier to a digital signal;

a gain detection portion that detects a gain of the amplifying device on the basis of the input signal and the feedback signal; and a device control portion that updates at least one of the mapping in the power supply control portion and the mapping in the amplitude control portion.

Configuration Example 8

Corresponding, for Example, to FIG. 6

A power amplifying device that is the power amplifying device described in (configuration example 7) above and characterized in that the followings are performed by the adaptive control method:

the gain detected in the gain detection portion is compared with a target gain;

in a case where the detected gain is higher than the target gain, the mapping of the amplitude of the input signal to the power supply control value is updated in a direction to lower the power supply voltage of the amplifier with a higher priority and the mapping of the amplitude of the input signal to the amplitude converting value is updated next in a direction to reduce the amplitude; and in a case where the detected gain is lower than the target gain, the mapping of the amplitude of the input signal to the amplitude converting value is updated in a direction to increase the amplitude with a higher priority and the mapping of the amplitude of the input signal to the power supply control value is updated next in a direction to increase the power supply voltage of the amplifier.

Configuration Example 9

Corresponding, for Example, to FIG. 8

A power amplifying device characterized by including:

an amplitude detection portion that detects an amplitude of an input signal;

an amplitude and phase control portion that outputs an amplitude converting value and a phase converting value corresponding to the detected amplitude;

an amplitude and phase conversion portion that converts the amplitude and a phase of the input signal according to the amplitude converting value and the phase converting value, respectively;

an amplitude detection portion that detects an amplitude of an output signal from the amplitude and phase conversion portion;

a power supply control portion that outputs a power supply control value corresponding to the detected amplitude;

an A-to-D converter that converts a feedback signal from an amplifier to a digital signal;

a gain and phase detection portion that detects a gain and a phase of the amplifying device on the basis of the input signal and the feedback signal; and a device control portion that updates at least one of mapping in the power supply control portion and mapping in the amplitude and phase control portion.

Configuration Example 10

Corresponding, for Example, to FIG. 1, FIG. 5, FIG. 7, and FIG. 8

A power amplifying device that is the power amplifying device described in any one of (configuration example 1) through (configuration example 9) and characterized by further including:

a D-to-A converter that converts an output signal from the amplitude control unit to an analog signal;

a quadrature modulator that applies quadrature modulation to an output signal from the D-to-A converter;

a power amplifier that amplifies power of an output signal from the quadrature modulator;

a D-to-A converter that converts an output signal from the power supply control unit to an analog signal; and a PA power supply portion that gives a power supply voltage to the power amplifier according to the output signal from the power supply control unit converted to the analog signal.

(The above has described the configuration examples.)

(The following will describe further configuration examples.)

Hereinafter, as further configuration examples, (configuration example 11) through (configuration example 17) will be described. It should be appreciated, however, that these configuration examples have no intention to limit the invention.

Configuration Example 11

Corresponding, for Example, to FIG. 1 and FIG. 7

An amplifying device that amplifies a signal subject to amplification, characterized by including:

an amplifier that amplifies a signal;

a power supply portion of the amplifier;

a level detection portion that detects a level of the signal subject to amplification;

an amplitude control portion that converts an amplitude of the signal subject to amplification to an amplitude mapped to the level of the signal detected in the level detection portion; and a power supply control portion that controls a power supply voltage of the power supply portion to be a power supply voltage mapped to the level of the signal detected in the level detection portion, and the amplifying device being characterized in that the amplifier amplifies the signal having the amplitude converted by the amplitude control portion.

Configuration Example 12

Corresponding, for Example, to FIG. 6 and FIG. 7

An amplifying device that is the amplifying device described in (Configuration Example 11) above and characterized in that:

the amplifying device further includes, a gain detection portion that detects a gain of the amplifying device at every level of the signal subject to amplification on the basis of the signal subject to amplification and a signal outputted from the amplifier, and an update processing portion that updates mapping by which to convert the amplitude of the signal subject to amplification in the amplitude control portion and mapping by which to control the power supply voltage in the power supply control portion at every level of the signal subject to amplification so that the gain of the amplifying device becomes closer to a target gain;

the update control portion compares the gain at every level of the signal subject to amplification detected by the gain detection portion with the target gain;

in a case where the detected gain is higher than the target gain, processing to update the mapping by which to control the power supply voltage in the power supply control portion in a direction to lower the power supply voltage is performed with a higher priority than processing to update the mapping by which to convert the amplitude of the signal subject to amplification in the amplitude control portion; and in a case where the detected gain is lower than the target gain, processing to update the mapping by which to convert the amplitude of the signal subject to amplification in the power supply control portion in a direction to increase the amplitude of the signal subject to amplification is performed with a higher priority than processing to update the mapping by which to control the power supply voltage in the power supply control portion.

Configuration Example 13

Corresponding, for Example, to FIG. 7

An amplifying device is the amplifying device described in (Configuration Example 11) above and characterized in that:

the amplitude control portion includes a storage portion that stores a table or a mathematical formula that maps a level of the signal subject to amplification detected in the level detection portion to an amplitude converting value used when the amplitude of the signal at the detected level is converted; and the power supply control portion includes a storage portion that stores a table or a mathematical formula that maps a level of the signal subject to amplification detected in the level detection portion to a power supply control value used when the power supply voltage is controlled.

Configuration Example 14

Corresponding, for Example, to FIG. 7

An amplifying device is the amplifying device described in (Configuration Example 13) above and characterized in that:

the storage portion of the amplitude control portion stores the mapping so that the gain of the amplifying device remains constant independently of the level of the signal subject to amplification; and the storage portion of the power supply control portion stores the mapping so that power efficiency of the amplifier reaches a maximum for the level of the signal subject to amplification.

Configuration Example 15

Corresponding, for Example, to FIG. 6 and FIG. 7

An amplifying device is the amplifying device described in (Configuration Example 13) above and characterized in that:

the amplifying device further includes, a gain detection portion that detects a gain of the amplifying device at every level of the signal subject to amplification on the basis of the signal subject to amplification and a signal outputted from the amplifier, and an update processing portion that updates mapping of the amplitude control value stored in the storage portion of the amplitude control portion and mapping of the power supply control value stored in the storage portion of the power supply control portion so that the gain of the amplifying device becomes closer to a target gain;

the update control portion compares the gain at every level of the signal subject to amplification detected by the gain detection portion with the target gain;

in a case where the detected gain is higher than the target gain, processing to update the mapping stored in the storage portion of the power supply control portion in a direction to lower the power supply voltage of the power supply portion is performed with a higher priority than processing to update the mapping stored in the storage portion of the amplitude control portion; and in a case where the detected gain is lower than the target gain, processing to update the mapping stored in the storage portion of the amplitude control portion in a direction to increase the amplitude of the signal subject to amplification is performed with a higher priority than processing to update the mapping stored in the storage portion of the power supply control portion.

Configuration Example 16

Corresponding, for Example, to FIG. 1, FIG. 5, and FIG. 6

An amplifying device that amplifies a signal subject to amplification, characterized by including:

an amplifier that amplifies a signal;

a power supply portion of the amplifier;

an amplitude control portion that converts an amplitude of the signal subject to amplification to an amplitude mapped to a level of the signal and outputs the converted signal to the amplifier;

a power supply control portion that controls a power supply voltage of the power supply portion to be a power supply voltage mapped to the level of the signal having the amplitude converted in the amplitude control portion;

a gain detection portion that detects a gain of the amplifying device at every level of the signal subject to amplification on the basis of the signal subject to amplification and a signal outputted from the amplifier; and an update processing portion that updates mapping by which to convert the amplitude of the signal subject to amplification in the amplitude control portion and mapping by which to control the power supply voltage in the power supply control portion at every level of the signal subject to amplification so that the gain of the amplifying device becomes closer to a target gain, and the amplifying device being characterized in that:

the update control portion compares the gain at every level of the signal subject to amplification detected by the gain detection portion with the target gain;

in a case where the detected gain is higher than the target gain, processing to update the mapping by which to control the power supply voltage in the power supply control portion in a direction to lower the power supply voltage is performed with a higher priority than processing to update the mapping by which to convert the amplitude of the signal subject to amplification in the amplitude control portion; and in a case where the detected gain is lower than the target gain, processing to update the mapping by which to convert the amplitude of the signal subject to amplification in the amplitude control portion in a direction to increase the amplitude of the signal subject to amplification is performed with a higher priority than processing to update the mapping by which to control the power supply voltage in the power supply control portion.

Configuration Example 17

Corresponding, for example, to FIG. 5

An amplifying device that is the amplifying device described in (Configuration Example 16) and characterized in that:

the amplitude control portion includes a storage portion that stores a table or a mathematical formula that maps a level of the signal subject to amplification to an amplitude converting value used when the amplitude of the signal at the detected level is converted; and the power supply control portion includes a storage portion that stores a table or a mathematical formula that maps a level of the signal having the amplitude converted in the amplitude conversion portion to a power supply control value used when the power supply voltage is controlled.

Advantageous Effects of Invention

As has been described, according to the amplifying device of the invention, it is possible to enhance power efficiency of an amplifier.

BRIEF DESCRIPTION OF DRAWINGS

FIG. 2(*a*) is a view showing an example of a gain characteristic, FIG. 2(*b*) is a view showing an example of an input-to-output characteristic, and FIG. 2(*c*) is a view showing an example of a power efficiency characteristic.

FIG. 14(*a*) is a view showing an example of a gain characteristic, FIG. 14(*b*) is a view showing an example of an input-to-output characteristic, and FIG. 14(*c*) is a view showing an example of a power efficiency characteristic.

DESCRIPTION OF EMBODIMENTS

Embodiments of the invention will be described with reference to the drawings.

First Embodiment

A first embodiment of the invention will be described.

Figure 1:
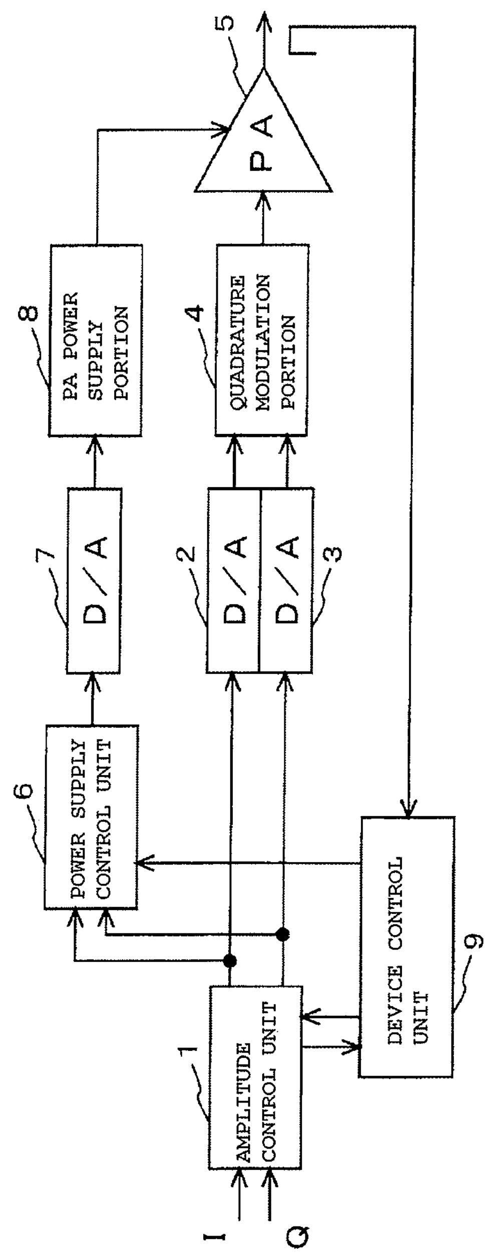
FIG. 1 is a view showing a configuration example of an amplifying device according to a first embodiment of the invention.

FIG. 1 shows a configuration example of an amplifying device (herein, a power amplifying device) according to one embodiment of the invention. As an example, the amplifying device of this embodiment is applied to a transmitter of a base station apparatus in a wireless communication system and input signals are signals to be transmitted.

The amplifying device of this embodiment includes an amplitude control unit 1, a D-to-A converter 2 corresponding to an I-phase, a D-to-A converter 3 corresponding to a Q-phase, a quadrature modulation portion 4, a power amplification portion (PA) 5, a power supply control unit 6, a D-to-A converter 7, a PA power supply portion 8, and a device control unit 9.

Figure 12:
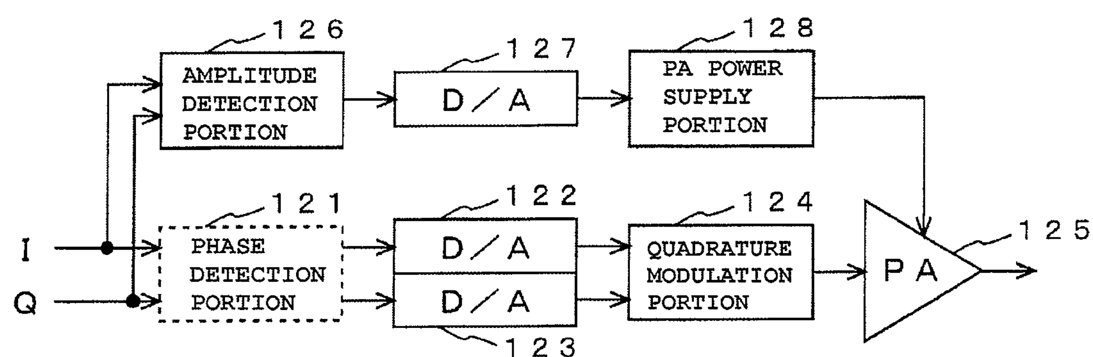
FIG. 12 is a view showing a configuration example of an amplifying device adopting a digital method and using the ET method or the EER method.
Figure 13:
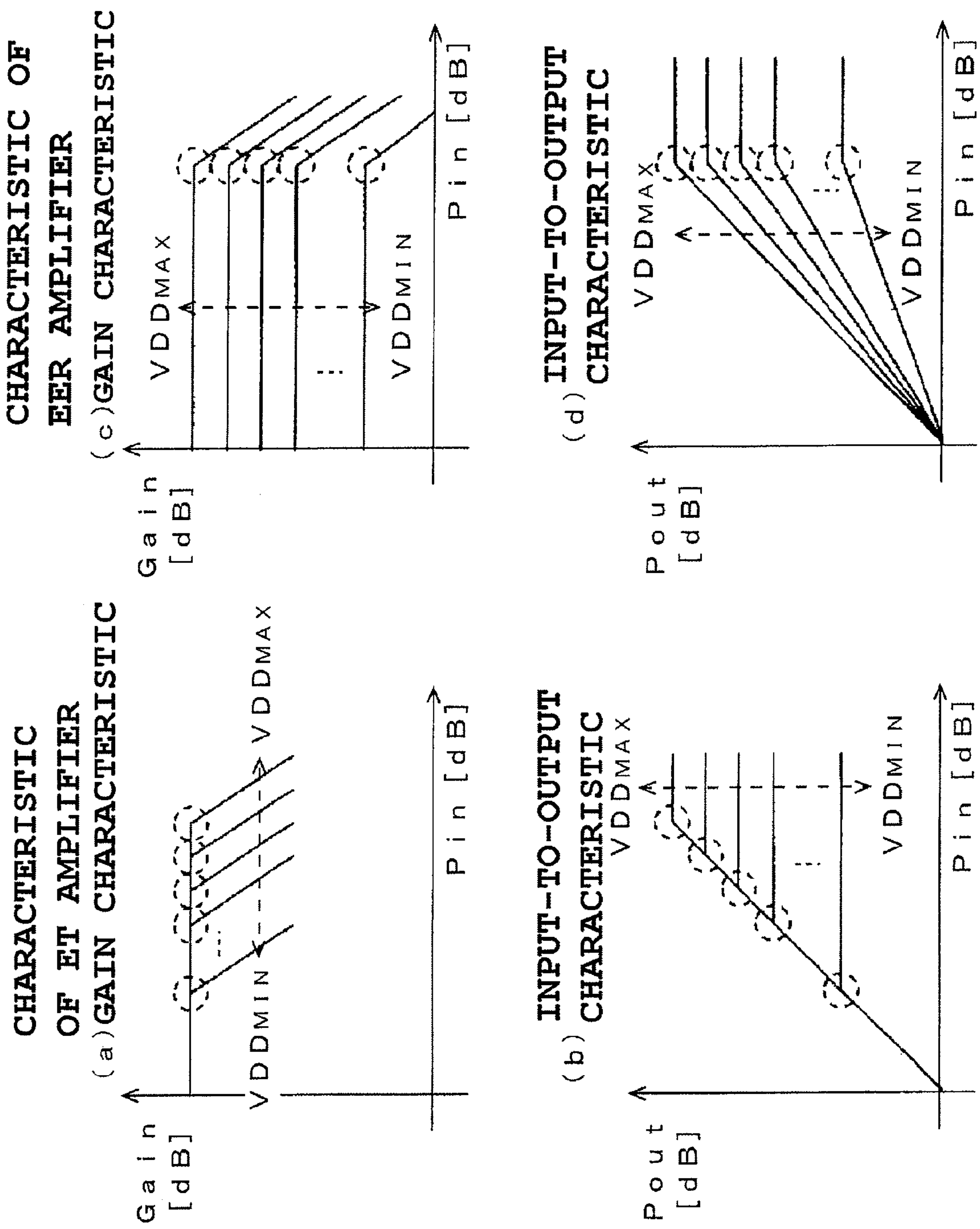
FIG. 13(*a*) and FIG. 13(*b*) are views showing examples of characteristics of an ET amplifier and FIGS. 13(*c*) and 13(*d*) are views showing examples of characteristics of an EER amplifier.
Figure 14:
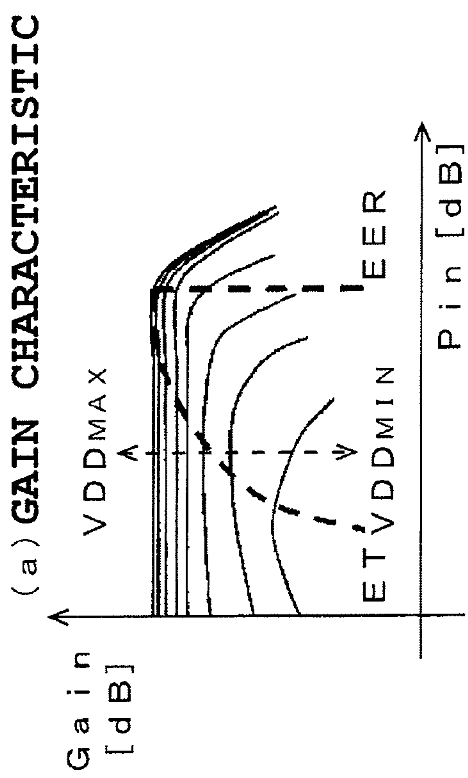
FIG. 14 shows characteristics of a typical amplifier.
Figure 14:
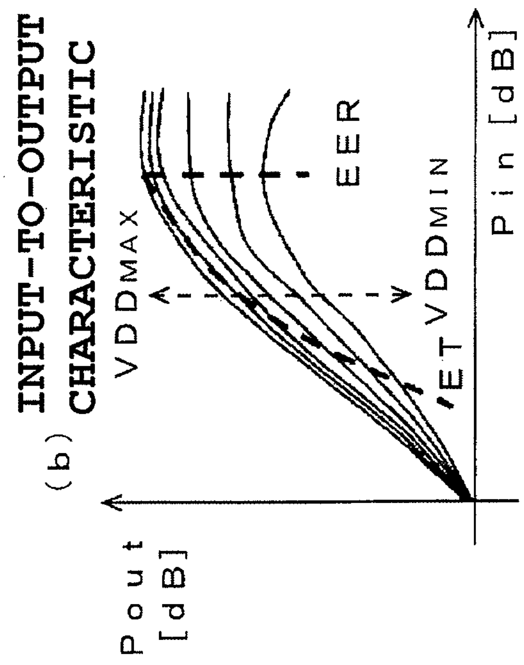
Figure 14:
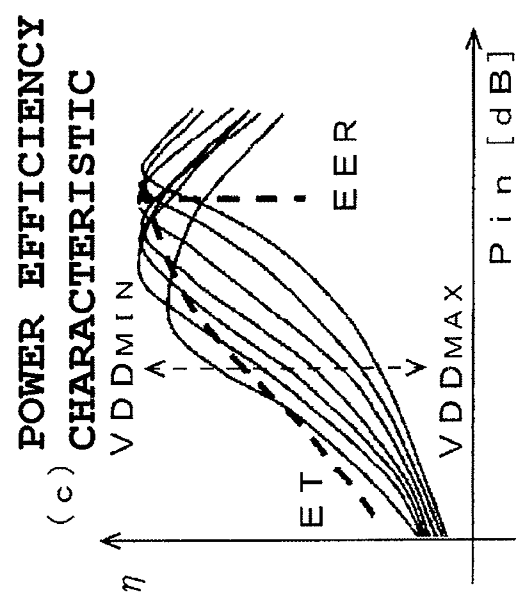

The D-to-A converter 2 corresponding to the I-phase, the D-to-A converter 3 corresponding to the Q-phase, the quadrature modulation portion 4, the power amplification portion (PA) 5, the D-to-A converter 7, and the PA power supply 8 can be of the same configurations and operate in the same manner, for example, as the corresponding processing portions 122, 123, 124, 125, 127 and 128, respectively, of the amplifying device shown in FIG. 12.

An example of an operation performed in the amplifying device of this embodiment will be described.

An input signal includes digital signals I(t) and Q(t) of the I-phase and the Q-phase, respectively. Herein, t denotes a time.

The amplitude control unit 1 performs amplitude control on the input signals. More specifically, the amplitude control unit 1 is furnished with a function of detecting amplitudes of the input signals and converting the amplitudes of the input signals according to the detected amplitudes. The amplitude control unit 1 outputs signals (of the I-phase and the Q-phase) having the amplitudes after conversion to the power supply control unit 6 and outputs an I-phase component of the signal having the amplitude after conversion to the D-to-A converter 2 and a Q-phase component of the signal having the amplitude after conversion to the D-to-A converter 3. Also, the amplitude control unit 1 outputs a signal having the detected amplitude to the device control unit 9.

Herein, the amplitudes of the input signals (herein, an instantaneous amplitude Env(t)) are found in accordance with (Equation 1) above.

The D-to-A converter 2 corresponding to the I-phase converts the signal of the I-phase component inputted therein from the amplitude control unit 1 in the form of a digital signal to an analog signal and outputs the resulting signal to the quadrature modulation portion 4.

The D-to-A converter 3 corresponding to the Q-phase converts the signal of the Q-phase component inputted therein from the amplitude control unit 1 in the form of a digital signal to an analog signal and outputs the resulting signal to the quadrature modulation portion 4.

The quadrature modulation portion 4 applies quadrature modulation to the signals inputted therein from the two D-to-A converters 2 and 3 and outputs the resulting signal to the PA 5.

The PA 5 amplifies the signal (herein, amplifies power) inputted therein from the quadrature modulation portion 4 and outputs the resulting signal. A part of an output signal (amplified signal) from the PA 5 is obtained by a directional coupler or the like and inputted into the device control unit 9 as a feedback signal.

Conversion of the amplitude in the amplitude control unit 1 will now be described.

Figure 2:
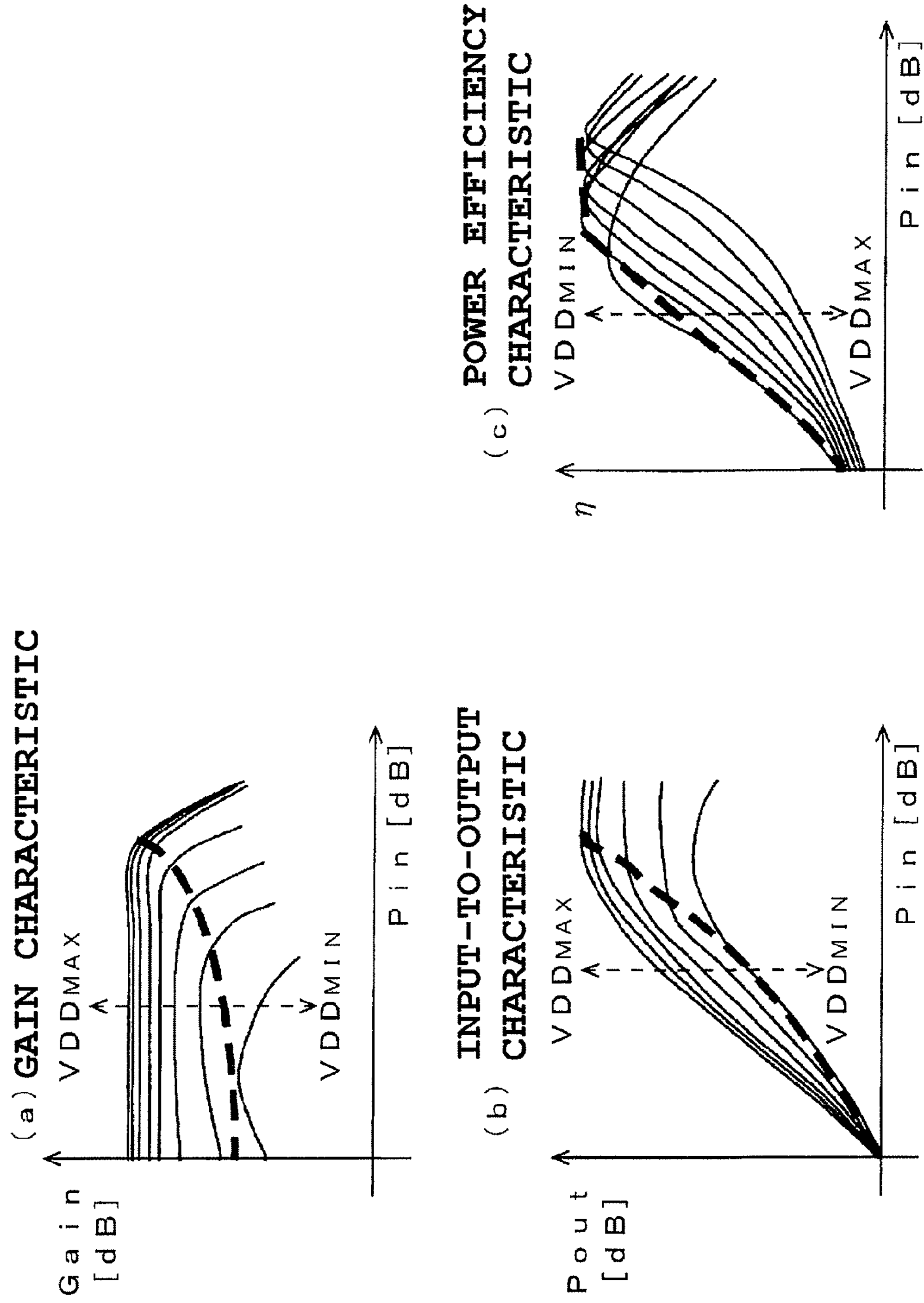
FIG. 2 shows characteristics of an amplifier of one embodiment.

FIGS. 2(*a*), 2(*b*), and 2(*c*) show characteristics of the amplifier (PA 5) of this embodiment. FIG. 2(*a*) shows an example of a gain characteristic. FIG. 2(*b*) shows an example of an input-to-output characteristic. FIG. 2(*c*) shows an example of a power efficiency characteristic.

In the graph of the gain characteristic, the abscissa represents input power (or input amplitude) Pin [dB] of the amplifier and the ordinate represents a gain (Gain) [dB].

In the graph of the input-to-output characteristic, the abscissa represents input power (or input amplitude) Pin [dB] of the amplifier and the ordinate represents output power (or output amplitude) Pout [dB] of the amplifier.

In the graph of the power efficiency characteristic, the abscissa represents input power (or input amplitude) Pin [dB] of the amplifier and the ordinate represents power efficiency $\eta$.

Also, the gain characteristic, the input-to-output characteristic, and the power efficiency characteristic show a plurality of characteristics in a case where a power supply voltage VDD of the amplifier is varied from a maximum value $VDD_{MAX}$ to a minimum value $VDD_{MIN}$ (where $VDD_{MAX}>VDD_{MIN}$).

As are shown in FIGS. 2(*a*), 2(*b*), and 2(*c*), the amplifying device of this embodiment is adjusted to have characteristics that go along trajectories indicated by a dotted line for power (amplitude) of the input signal into the amplifier (PA 5) as a preferable example.

Regarding conversion of the amplitude in the amplitude control unit 1, because a gain of the amplifier (PA 5) is not constant as are shown in FIGS. 2(*a*) and 2(*b*), a preferable mapping manner is thought to convert the amplitude so that a gain of the output signal of the PA 5 with respect to a signal before amplitude conversion remains constant. In other words, the amplitude of an input signal to the amplifying device is converted so that a gain of the amplifying device of this embodiment remains constant.

This embodiment is characterized in that a gain is made constant by the amplitude control unit 1 together with the power supply control unit 6.

Figure 3:
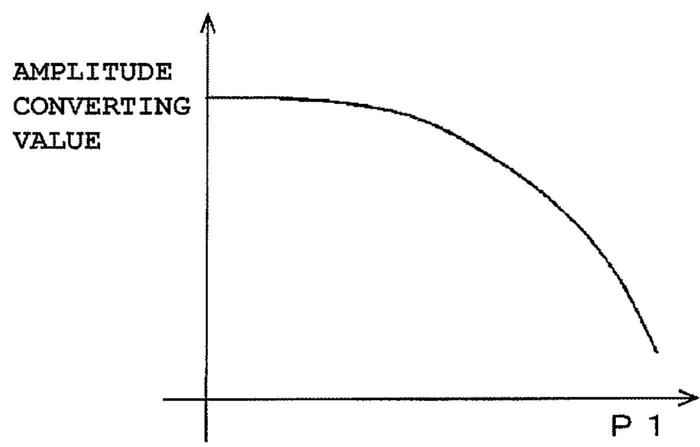
FIG. 3 is a view showing an example of an amplitude converting value.

FIG. 3 shows an example of an amplitude converting value used in the amplitude control unit 1.

More specifically, the abscissa of the graph represents an amplitude (or power) P1 that is referred to and the ordinate represents an amplitude converting value.

Mapping referring to the amplitude converting value shown in FIG. 3 is stored, for example, in a memory of an amplitude control portion (in one embodiment, an amplitude control portion 12 shown in FIG. 5) of the amplitude control unit 1 for use at a later time, and the amplitude (or power) P1 that is referred to is information on the amplitude (or power) inputted into the amplitude control portion.

In this embodiment, the amplitude conversion function is achieved by the mapping referring to the amplitude converting value shown in FIG. 3.

The power supply control unit 6 detects the amplitudes of the input signals from the amplitude control unit 1 and outputs a power supply control value of the power supply voltage VDD to be given to the PA 5 that corresponds to the detected amplitude to the D-to-A converter 7.

The D-to-A converter 7 converts the power supply control value inputted therein from the power supply control unit 6 in the form of a digital signal to an analog signal and outputs the resulting signal to the PA power supply portion 8.

The PA power supply portion 8 controls the magnitude of the power supply voltage to be given to the PA 5 according to the power supply control value inputted therein from the power supply control unit 6 via the D-to-A converter 7. In this embodiment, assume that the power supply voltage to be given to the PA 5 from the PA power supply portion 8 becomes higher as the power supply control value becomes larger.

The power supply control value used in the power supply control unit 6 will now be described.

For example, in contrast to the amplifying device using the related art method shown in FIG. 12 that is configured in such a manner that a power supply control value of the power supply voltage VDD proportional to the amplitude detected by the amplitude detection portion 126 is outputted to the D-to-A converter 127, the power supply control unit 6 of this embodiment is characterized by mapping the detected amplitude to a nonlinear value.

Regarding the power supply control value used in the power supply control unit 6, a preferable mapping manner is thought to give the power supply voltage VDD in such a manner that the amplifier operates in a region where power efficiency indicated by the power efficiency characteristic shown in FIG. 2(*c*) is high and the gain and the output power indicated by the gain characteristic shown in FIG. 2(*a*) and the input-to-output characteristic shown in FIG. 2(*b*), respectively, are stable. As an example, the amplifier is operated as are indicated by dotted lines in FIGS. 2(*a*), 2(*b*), and 2(*c*).

Figure 4:
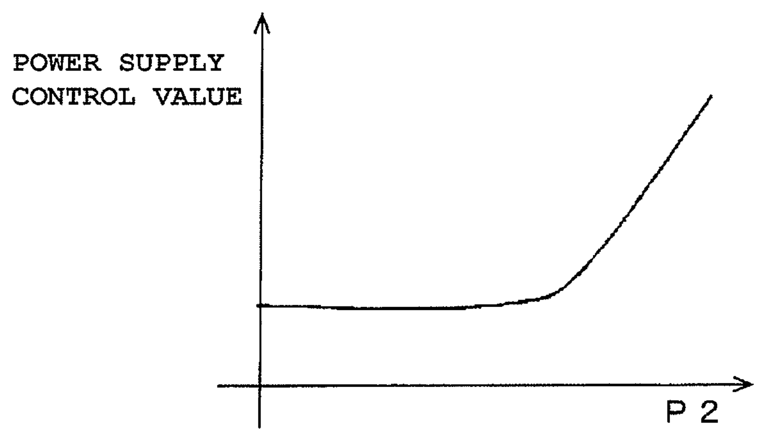
FIG. 4 is a view showing an example of a power supply control value.

FIG. 4 shows an example of the power supply control value used in the power supply control unit 6.

More specifically, the abscissa of the graph represents the amplitude (or power) P2 that is referred to and the ordinate represents the power supply control value.

The mapping referring to the power supply control value shown in FIG. 4 is stored, for example, in a memory of a power supply control portion (in one embodiment, a power supply control portion 22 shown in FIG. 5) in the power supply control unit 6 for use at a later time and the amplitude (or power) P2 that is referred to is information on the amplitude (or power) inputted into the power supply control portion.

In this embodiment, the power control function is achieved by the mapping referring to the power supply control value as shown in FIG. 4.

The device control unit 9 is furnished with a function of adaptively controlling the mapping of (the amplitude (or power) of an input signal with respect to the amplitude converting value) stored in the amplitude control unit 1 and the mapping of (the amplitude (or power) of an input signal with respect to the power supply control value) stored in the power supply control unit 6. In this embodiment, the device control unit 9 controls the gain and power efficiency, for example, to be always maintained satisfactorily according to a signal obtained by feeding back a part of an output signal from the PA 5 and a signal of the amplitude from the amplitude control unit 1.

A frequency converter (up converter) is normally provided between the quadrature modulation portion 4 and the PA 5 depending on a radio frequency. However, this frequency converter is not shown in FIG. 1.

Likewise, a frequency converter (down converter) is normally provided between the PA 5 and the device control unit 9 depending on a radio frequency. However, this frequency converter is not shown in FIG. 1.

Figure 5:
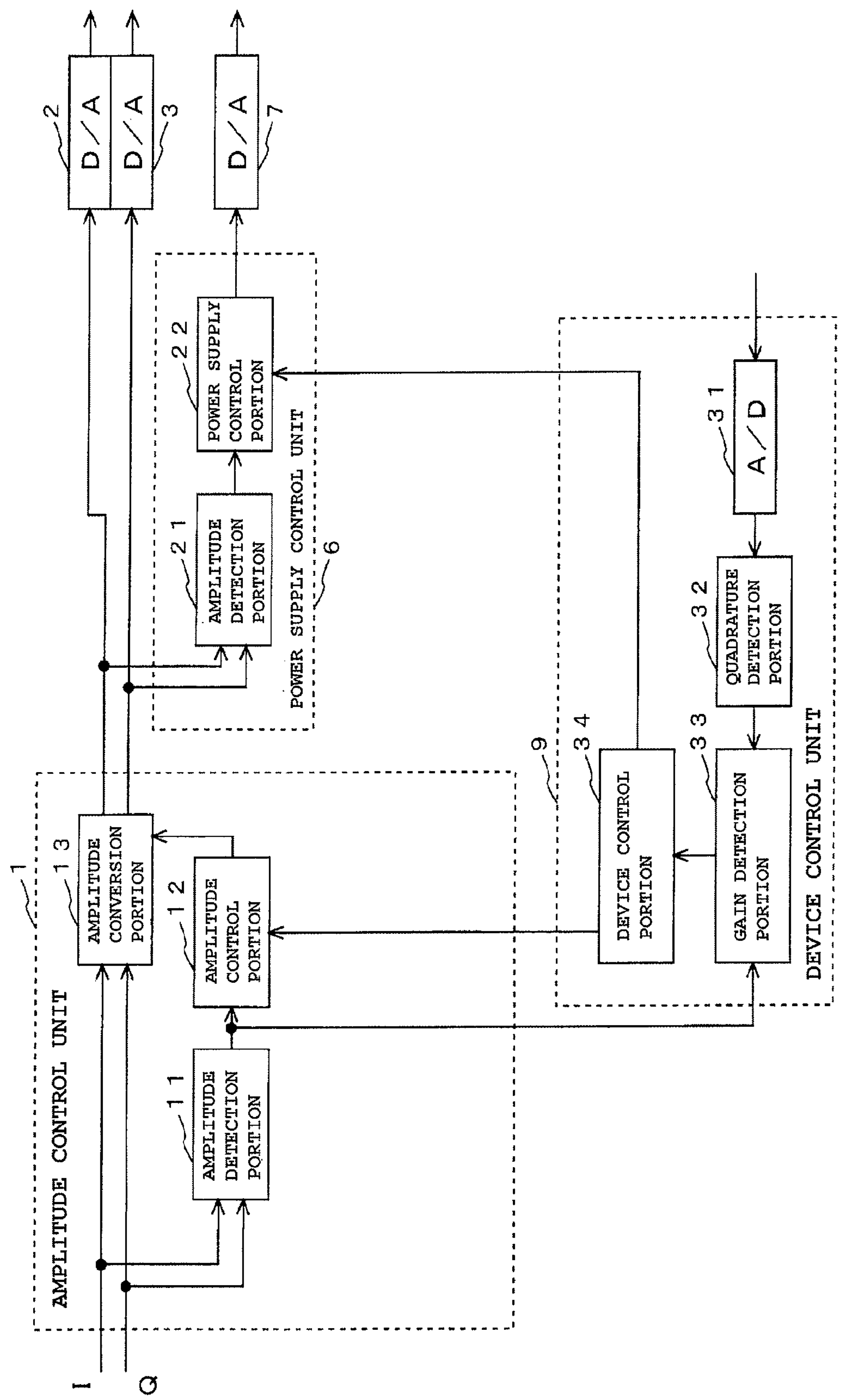
FIG. 5 is a view showing a configuration example of an amplifying device according to a second embodiment of the invention.

In addition, in this embodiment, a quadrature detection portion (in one embodiment, a digital quadrature detector 32 shown in FIG. 5) used in an analog portion or a digital portion is provided for the feedback signal to the device control unit 9. However, this quadrature detection portion is not shown in FIG. 1.

Also, this embodiment describes the analog quadrature modulation by way of example. In a case where digital quadrature modulation is performed, a digital quadrature modulation portion is provided between the amplitude control unit 1 and the D-to-A converters 2 and 3 (a stage preceding to the D-to-A converters 2 and 3) and the two D-to-A converters 2 and 3 are replaced by a single D-to-A converter. Also, the analog quadrature modulation portion 4 becomes unnecessary and is therefore omitted.

As has been described, the amplifying device of this embodiment includes the amplitude control unit 1 that converts an amplitude of an input signal according to the amplitude (or power) of the input signal and the power supply control unit 6 that controls a power supply voltage of the power amplifier (PA 5) according to the converted amplitude (or power).

Also, the amplifying device of this embodiment includes the D-to-A converters 2 and 3 that convert an output signal from the amplitude control unit 1 to an analog signal, the quadrature modulation portion 4 formed of a quadrature modulator that applies quadrature modulation to output signals from the D-to-A converters 2 and 3, the PA 5 formed of a power amplifier that amplifies power of an output signal of the quadrature modulation portion 4, the D-to-A converter 7 that converts an output signal of the power supply control unit 6 to an analog signal, and the PA power supply portion 8 that gives a power supply voltage to the PA 5 (power amplifier) according to an output signal of the power supply control unit 6 that is now converted to an analog signal.

In the amplifying device of this embodiment, the mapping by which to convert the amplitude in the amplitude control unit 1 establishes a relation by which the amplitude is converted so that a gain of the amplifying device remains constant independently of the amplitude of an input signal (or a relation by which substantially the same is achieved).

Also, in the amplifying device of this embodiment, the mapping by which to control the power supply voltage in the power supply control unit 6 establishes a relation by which the power supply voltage is controlled so that power efficiency of the power amplifier (PA 5) reaches a maximum for the amplitude of an input signal (or a relation by which substantially the same is achieved).

Also, the amplifying device of this embodiment includes the device control unit 9 that controls (for example, adaptively controls) at least one of the mapping in the amplitude control unit 1 and the mapping in the power supply control unit 6.

Hence, according to the amplifying device of this embodiment, it becomes possible to increase efficiency of the power amplifier (PA 5), for example, in a configuration of an amplitude-modulation type ET power amplifying device. It thus becomes possible to achieve, as an example, a power amplifying device that eliminates a need of complex adjustment of the PA and maximizes power efficiency.

The amplifying device of this embodiment can operate in a region where the amplifier is stable as are indicated by dotted lines of FIGS. 2(*a*), 2(*b*), and 2(*c*) and maximize power efficiency. Also, the amplifying device of this embodiment can maintain a gain of the amplifying device constant.

Also, the amplifying device of this embodiment can maintain an operation of the device (for example, the amplitude converting value and the power supply control value) satisfactorily due to the feedback control.

In the amplifying device of this embodiment shown in FIG. 1, in a case where a signal is amplified by the amplifier of the PA 5, the level control means is formed by the function furnished to the amplitude control unit 1 and the power supply control means is formed by the function furnished to the power supply control unit 6 (the function furnished to the PA power supply portion 8 may be further included).

Second Embodiment

A second embodiment of the invention will be described.

FIG. 5 shows a configuration example of an amplifying device according to one embodiment of the invention.

Schematic configuration and operation of the amplifying device of this embodiment are the same as those of the amplifying device shown in FIG. 1. Herein, detailed examples of the amplitude control unit 1, the power supply control unit 6, and the device control unit 9 will be described.

In FIG. 5, the quadrature modulation portion 4, the PA 5, and the PA power supply portion 8 are omitted.

The amplitude control unit 1 includes an amplitude detection portion 11, an amplitude control portion 12, and an amplitude conversion portion 13.

The device control unit 6 includes an amplitude detection portion 21 and a power supply control portion 22.

The device control unit 9 includes an A-to-D (Analog to Digital) converter 31, a quadrature detection portion 32, a gain detection portion 33, and a device control portion 34.

The amplitude control unit 1 will be described.

An input signal to the amplitude control unit 1 includes digital signals I(t) and Q(t) of an I-phase and Q-phase, respectively.

For example, as with the counterpart in the related art, the amplitude detection portion 11 finds an instantaneous amplitude Env(t) for the input signals I(t) and Q(t) in accordance with (Equation 1) above. Also, the amplitude detection portion 11 outputs a signal having the detected amplitude to the amplitude control portion 12 and to the gain detection portion 33 of the device control unit 9.

The amplitude control portion 12 holds information on the amplitude converting value as shown in FIG. 3 and outputs an amplitude converting value corresponding to the instantaneous amplitude Env(t) detected by the amplitude detection portion 11 to the amplitude conversion portion 13.

The amplitude conversion portion 13 converts amplitudes of the input signals I(t) and Q(t) according to the amplitude converting value inputted therein from the amplitude control portion 12 and outputs the converted signals to the D-to-A converters 2 and 3 and to the amplitude detection portion 21 of the power supply control unit 6.

As an example, the amplitude control portion 12 outputs an amplitude converting value stored in a memory (for example, a look-up table (LUT)) using the instantaneous amplitude Env(t) (P1 shown in FIG. 3) as a reference address. As another example, the amplitude control portion 12 outputs an amplitude converting value computed by an approximation formula using the instantaneous amplitude Env(t) (P1 shown in FIG. 3) as a variable.

As a manner in which to convert the amplitudes of the input signals I(t) and Q(t) according to the amplitude converting value in the amplitude conversion portion 13, this embodiment adopts a manner in which the input signals I(t) and Q(t) are multiplied by the amplitude converting value. As an example, a separate multiplier is provided for each of the I-phase and the Q-phase and a signal of each phase is multiplied by the amplitude converting value.

The power supply control unit 6 will be described.

An input signal into the power supply control unit 6 includes digital signals I1(*t*) and Q1(*t*) of an I-phase and a Q-phase, respectively.

For example, as with the counterpart in the related art, the amplitude detection portion 21 finds an instantaneous amplitude Env1(*t*) for the input signals I1(*t*) and Q1(*t*) in accordance with (Equation 1) above. Also, the amplitude detection portion 21 outputs a signal having the amplitude thus found to the power supply control portion 22.

The power supply control portion 22 holds information on the power supply control value as shown in FIG. 4 and outputs a power supply control value of the power supply voltage VDD to be given to the PA 5 that corresponds to the instantaneous amplitude Env1(*t*) detected by the amplitude detection portion 21 to the D-to-A convertor 7.

As an example, the power supply control portion 22 outputs a power supply control value stored in a memory (for example, a look-up table (LUT)) using the instantaneous amplitude Env1(*t*) (P2 shown in FIG. 4) as a reference address. Also, as another example, the power supply control portion 22 outputs a power supply control value computed by an approximation formula using the instantaneous amplitude Env1(*t*) (P2 shown in FIG. 4) as a variable.

The device control unit 9 will be described.

A signal obtained by feeding back a part of an output signal of the PA 5 is inputted into the A-to-D converter 31.

The A-to-D converter 31 converts the signal (feedback signal) inputted therein in the form of an analog signal to a digital signal and outputs the resulting signal to the quadrature detection portion 32.

The quadrature detection portion 32 applies quadrature detection to the signal inputted therein from the A-to-D converter 31 and outputs the resulting signal to the gain detection portion 33.

The gain detection portion 33 is furnished with a function of detecting an instantaneous amplitude FB(t) of the signal (signal from the feedback side) inputted therein from the quadrature detection portion 32, for example, in accordance with (Equation 1) above and receives an input of a signal having the detected amplitude (information on the instantaneous amplitude Env(t) of the input signal) from in the amplitude detection portion 11 of the amplitude control unit 1.

Also, the gain detection portion 33 detects a gain Gain(Env (t)) for every instantaneous amplitude Env(t) of the input signal in accordance with (Equation 5) below on the basis of the instantaneous amplitude Env(t) of the input signal detected by the amplitude detection portion 11 and the instantaneous amplitude FB(t) of the signal on the feedback side, and outputs the result to the device control portion 34.

[Formula 5]

$$\mathrm{Gain}(Env(t))=FB(t)/Env(t) \qquad \text{(Equation 5)}$$

In (Equation 5) above, Gain denotes a function of Env(t) and FB(t) can be found in the same manner as Env(t) (expressed by (Equation 1) above) using I-phase and Q-phase signals of the quadrature-detected feedback signal.

In this embodiment, the device control portion 34 adaptively controls the mapping held in the amplitude control portion 12 of the amplitude control unit 1 and the mapping held in the power supply control portion 22 of the power supply control unit 6 so that the gain Gain(Env(t)) detected by the gain detection portion 33 remains constant. By the adaptive control, as an example, a content of the mapping (for example, a value for the mapping and a coefficient of an equation for the mapping) is computed to optimize the mapping and the mapping is updated by the computation result.

In this embodiment, the device control portion 34 controls both of the mapping held in the amplitude control portion 12 of the amplitude control unit 1 and the mapping held in the power supply control portion 22 of the power supply control unit 6. It should be appreciated, however, that the device control portion 34 may be configured to control either one of these mappings alone.

Figure 6:
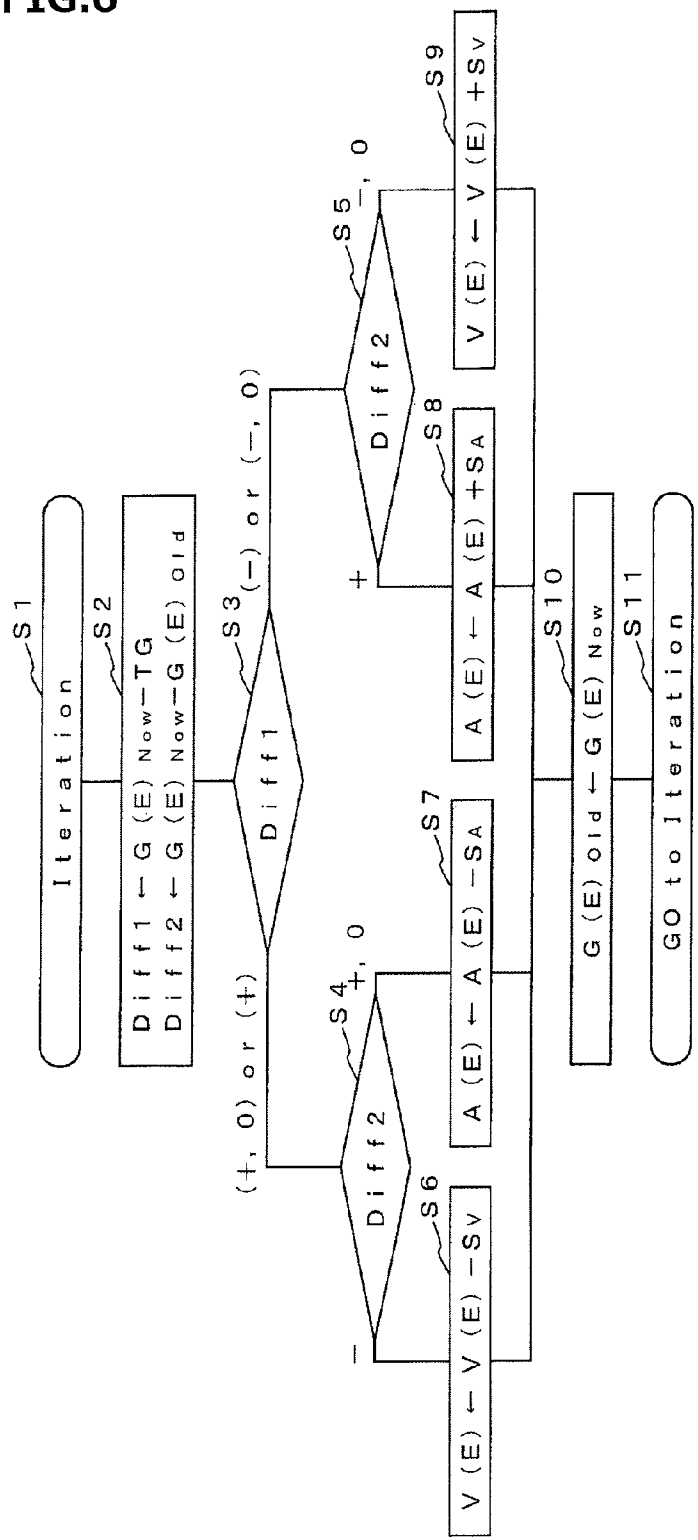
FIG. 6 is a view showing a flowchart depicting a procedure example of processing performed by a device control portion.

FIG. 6 shows an example procedure of processing performed by the device control portion 34. This processing is performed, for example, by an adaptive algorithm set in the device control portion 34.

Firstly, signs used in the flowchart of FIG. 6 will be described.

The amplitude E is equivalent to an amplitude corresponding to input power (or input amplitude) Pin of the amplifier shown in FIG. 2(*a*).

$G(E)_{Now}$ denotes a gain at the amplitude E of this time (after update).

$G(E)_{Old}$ denotes a gain at the amplitude E of the last time (before update).

TG denotes a target gain. The target gain TG is a target value of the gain and is preferably a gain necessary to obtain output power that is maximum power (maximum amplitude).

V(E) denotes a power supply control value at the amplitude E.

A(E) denotes an amplitude converting value at the amplitude E.

$S_V$ denotes a step size when the power supply control value is updated.

$S_A$ denotes a step size when the amplitude converting value is updated.

Herein, each of the update step size $S_v$ of the power supply control value and the update step size $S_A$ of the amplitude converting value is a positive value.

A flow of the flowchart of FIG. 6 will now be described.

In this embodiment, processing from Step S2 through Step S10 is performed repetitively (Step S1 and Step S11).

Firstly, a result of subtracting TG from $G(E)_{Now}$ is assigned to Diff1 and a result of subtracting $G(E)_{Old}$ from $G(E)_{Now}$ is assigned to Diff2 (Step S2).

Subsequently, whether Diff1 is positive or 0 is determined (Step S3). In a case where Diff1 is determined as being positive or 0, the flow proceeds to processing in Step S4. On the other hand, in a case where Diff1 is determined as being negative, the flow proceeds to processing in Step S5.

As an alternative configuration example, it may be configured in such a manner that whether Diff1 is positive is determined (Step S3), so that the flow proceeds to processing in Step S4 in a case where Diff1 is determined as being positive and to processing Step S5 in a case where Diff1 is determined as being negative or 0.

By the processing in Step S4, whether Diff2 is negative is determined (Step S4). In a case where Diff2 is determined as being negative, V(E) is updated by subtracting $S_V$ from V(E) (Step S6). On the other hand, in a case where Diff2 is determined as being positive or 0, A(E) is updated by subtracting $S_A$ from A(E) (Step S7).

By the processing in Step S5, whether Diff2 is positive is determined (Step S5). In a case where Diff2 is determined as being positive, A(E) is updated by adding $S_A$ to A(E) (Step S8). In a case where Diff2 is determined as being negative or 0, V(E) is updated by adding $S_V$ to V(E) (Step S9).

After the processing in any one of Step S6 through Step S9 is performed, this procedure is repeated by assigning $G(E)_{Now}$ to $G(E)_{Old}$ (Step S10).

As has been described, in this embodiment, the operation is divided to four types of processing (Step S6 through Step S9) as a combination of two states determined by Diff1 indicating a relation as to which of the gain $G(E)_{Now}$ at the amplitude E of this time (after update) and the target gain TG is larger or smaller and two states determined by Diff2 indicating a relation as to which of the gain $G(E)_{Now}$ at the amplitude E of this time (after update) and the gain $G(E)_{Old}$ at the amplitude E of the last time (before update) is larger or smaller.

Also, in this embodiment, the power supply control value V(E) or the amplitude converting value A(E) is repetitively updated according to the flow and the gain ($G(E)_{Now}$) becomes constant due to this adaptive algorithm. Also, in this embodiment, a priority is placed on the processing to lower the power supply voltage and the amplifier therefore operates in a near-saturated condition. Hence, power efficiency is increased to the maximum.

Schematically speaking, in a case where the gain $G(E)_{Now}$ is larger than the target gain TG and is therefore decreased, by the processing in Step S6 and the processing in Step S7, power consumption is reduced basically by lowering the power supply voltage by decreasing the power supply control value V(E), and when the gain $G(E)_{Now}$ no longer varies even when the power supply control value V(E) is decreased, the amplitude of an input signal is controlled by decreasing the amplitude converting value A(E).

Also, schematically speaking, in a case where the gain $G(E)_{Now}$ is smaller than the target gain TG and is therefore increased, by the processing in Step S8 and the processing in Step S9, an increase of power consumption is prevented basically by controlling the amplitude of an input signal by increasing the amplitude converting value A(E) and when the gain $G(E)_{Now}$ no longer varies even when the amplitude converting value A(E) is increased, the power supply voltage is increased by increasing the power supply control value V(E).

Also, each of the update step size $S_V$ of the power supply control value and the update step size $S_A$ of the amplitude converting value can be either a fixed value or a variable value.

For example, the magnitude of these step sizes $S_y$ and $S_A$ is designed on the basis of a convergence time and accuracy of the gain. In a case where the step size is large, the convergence time becomes shorter and a degree of accuracy of the gain becomes lower. On the contrary, in a case where the step size is small, the convergence time becomes longer and a degree of accuracy of the gain becomes higher.

As an example, in a case where the number of iterations of the processing depicted in FIG. 6 becomes larger than a predetermined number of times or Diff1 becomes smaller than a predetermined value, it becomes possible to accelerate the initial convergence and increase a degree of accuracy of the gain by reducing the step size.

As another example, in the flow depicted in FIG. 6, in a case where Diff1 is determined as being 0 (Step S3), it may be configured in such a manner that the flow skips to Step S11 without performing the subsequent processing (processing in Step S4 through Step S10). In this embodiment, a case where Diff1 is determined as being 0 (Step S3) is deemed as a case where Diff1 is determined as being "+ (positive)" or "– (negative)".

Also, in this embodiment, 0 is set as a branching reference of Diff2 in the processing in Step S4 and the processing in Step S5. However, it is also possible to set the branching reference to a value other than 0.

As has been described, in the amplifying device of this embodiment, the amplitude control unit 1 includes the amplitude detection portion 11 that detects an amplitude of an input signal, the amplitude control portion 12 that outputs the amplitude converting value corresponding to the detected amplitude, and the amplitude conversion portion 13 that converts the amplitude of the input signal according to the amplitude converting value.

Also, in the amplifying device of this embodiment, the power supply control unit 6 includes the amplitude detection portion 21 that detects an amplitude of an input signal from the amplitude control unit 1 and the power supply control portion 22 that outputs the power supply control value corresponding to the detected amplitude.

Also, in the amplifying device of this embodiment, the device control unit 9 includes the A-to-D converter 31 that converts a feedback signal from the amplifier (PA 5) to a digital signal, the quadrature detection portion 32 that applies quadrature detection to the converted digital signal, the gain detection portion 33 that detects a gain of the amplifying device on the basis of a signal on the input side and a signal on the feedback side, and the device control portion 34 that updates at least one of the mapping in the amplitude control portion 12 and the mapping in the power supply control portion 22.

Also, in the amplifying device of this embodiment, the adaptive control method performed by the device control portion 34 is configured as follows. That is, the gain detected in the gain detection portion 33 is compared with the target gain. In a case where the detected gain is higher than the target gain, a priority is placed on the processing to update the mapping between the amplitude of the input signal and the power supply control value corresponding to a direction to lower the power supply voltage of the amplifier and the mapping between the amplitude of the input signal and the amplitude converting value is performed next in a direction to reduce the amplitude. In a case where the detected gain is lower than the target gain, a priority is placed on the processing to update the mapping between the amplitude of the input signal and the amplitude converting value in a direction to increase the amplitude and the mapping between the amplitude of the input signal and the power supply control value is performed next in a direction to increase the power supply voltage of the amplifier.

In the amplifying device of this embodiment shown in FIG. 5, the level control means is formed by the functions furnished to the amplitude detection portion 11, the amplitude control portion 12, and the amplitude conversion portion 13 provided to the amplitude control unit 1 and the power supply control means is formed by the functions furnished to the amplitude detection portion 21 and the power supply control portion 22 provided to the power supply control unit 6 (the function furnished to the PA power supply portion 8 may be further included).

Also, in the amplifying device of this embodiment shown in FIG. 5, the gain detection means is formed by the function furnished to the gain detection portion 33 and the update means is formed by the function furnished to the device control portion 34.

Third Embodiment

A third embodiment of the invention will be described.

Figure 7:
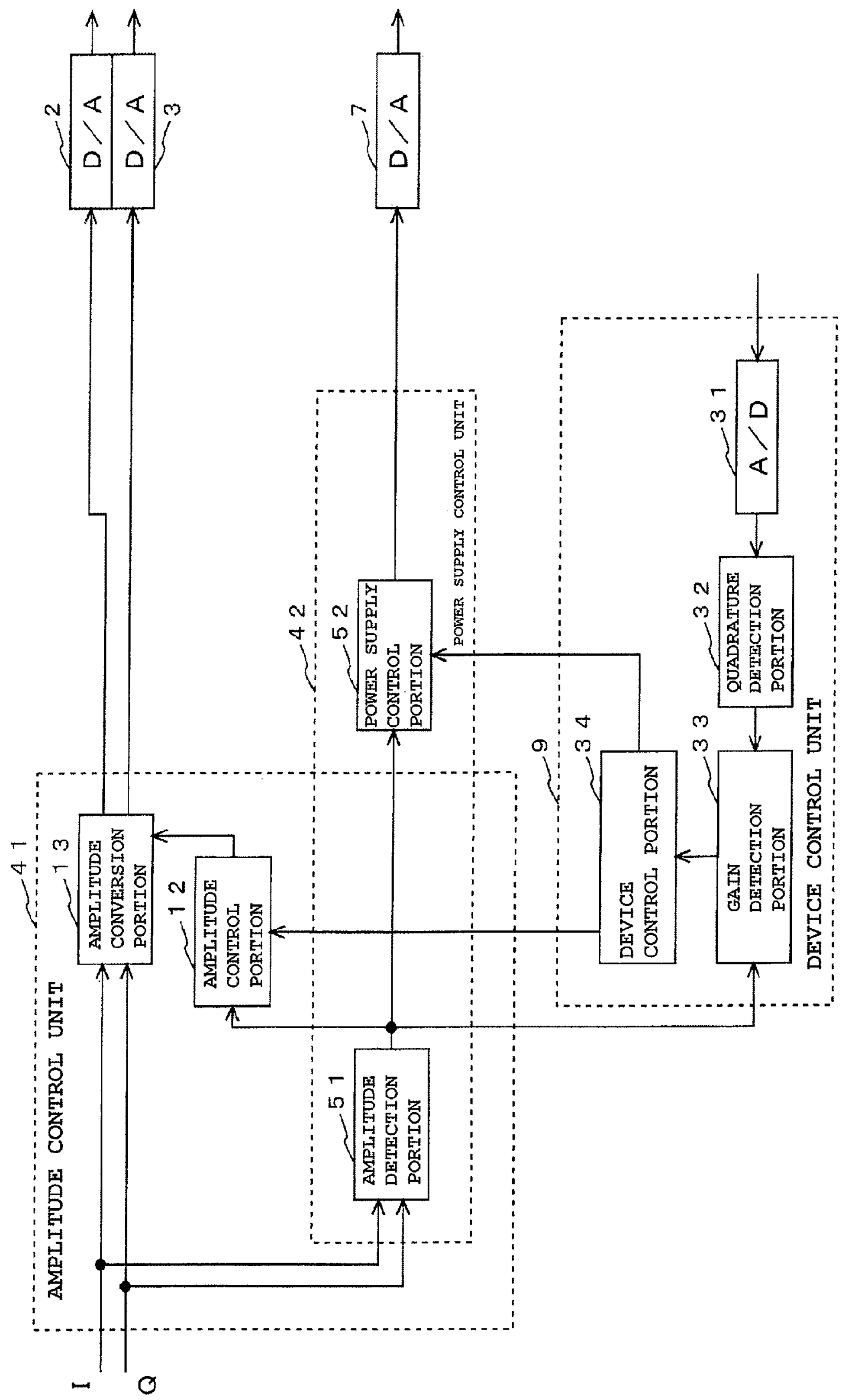
FIG. 7 is a view showing a configuration example of an amplifying device according to a third embodiment of the invention.

FIG. 7 shows a configuration example of an amplifying device according to still another embodiment of the invention.

A configuration and an operation of the amplifying device of this embodiment are the same as those of the amplifying device shown in FIG. 5 except for a portion relating to an amplitude control unit 41 and a power supply control unit 42.

In short, in the amplifying device of this embodiment, the amplitude detection portion 11 of the amplitude control unit 1 and the amplitude detection portion 21 of the power supply control unit 6 in the amplifying device shown in FIG. 5 are provided in common.

The amplitude control unit 41 of this embodiment includes an amplitude detection portion 51 used in common with the power supply control unit 42, an amplitude control portion 12, and an amplitude conversion portion 13.

The power supply control unit 42 of this embodiment includes the amplitude detection portion 51 used in common with the amplitude control unit 41 and a power supply control portion 52.

Configurations and operations of the amplitude control portion 12 and the amplitude conversion portion 13 of the amplitude control unit 41 are the same as those of the amplifying device shown in FIG. 5.

An example of an operation performed in the amplifying device of this embodiment will be described. Herein, a difference from the amplifying device shown in FIG. 5 will be described.

For example, as with the counterpart in the related art, the amplitude detection portion 51 finds an instantaneous amplitude Env(t) for input signals I(t) and Q(t) in accordance with (Equation 1) above. Also, the amplitude detection portion 51 outputs a signal having the amplitude thus found to the amplitude control portion 12, the gain detection portion 33 of the device control unit 9, and the power supply control portion 52.

A function furnished to the amplitude detection portion 51 of this embodiment is the same as the function furnished to the amplitude detection portion 11 shown in FIG. 5 except that an output destination is different.

The power supply control portion 52 outputs a power supply control value of the power supply voltage VDD to be given to the PA 5 that corresponds to the instantaneous amplitude Env1(*t*) detected by the amplitude detection portion 51 to the D-to-A converter 7.

It should be noted that the power supply control portion 52 of this embodiment holds information on the amplitude converting value as shown in FIG. 3 and information on the power supply control value as shown in FIG. 4 either separately or collectively (for example, by single mapping). In comparison with the power supply control portion 22 shown in FIG. 5, the power supply control portion 52 outputs a power supply control value corresponding to an input so that the power supply control values for the respective amplitudes of input signals into the amplifying device become equal. More specifically, in contrast to the case of FIG. 5 where a signal having the amplitude after amplitude conversion is inputted into the power supply control portion 22, a signal having the amplitude before amplitude conversion is inputted into the power supply control portion 52 in this embodiment. Hence, the power control portion 52 determines the power supply control value to be outputted also in consideration of amplitude conversion.

As has been described, the instantaneous amplitude Env(t) inputted into the power supply control portion 52 of this embodiment is different from the one shown in FIG. 5. However, as is shown in FIG. 3, the input signals into the amplitude detection portion 21 of FIG. 5 are maps (one-to-one correspondence) of the input signals into the amplitude detection portion 11. Hence, the power supply control unit 42 of this embodiment can achieve a function same as the one in the case shown in FIG. 5.

Advantages of the amplifying device of this embodiment will be compared with those of the amplifying device shown in FIG. 5.

In the amplifying device of this embodiment, a circuit size can be reduced by using the amplitude detection portion 51 in common with the amplitude control unit 41 and the power supply control unit 42. However, in a case where the mapping in the amplitude control portion 12 as shown in FIG. 3 is changed, it becomes necessary to change the mapping in the power supply control portion 52 (for example, the mapping as shown in FIG. 4).

On the contrary, in the amplifying device shown in FIG. 5, the mapping in the amplitude control portion 12 as shown in FIG. 3 and the mapping in the power supply control portion 22 as shown in FIG. 4 are independent of each other. It is, however, thought that a circuit size is relatively large in comparison with the amplifying device of this embodiment.

In the amplifying device of this embodiment shown in FIG. 7, the level control means is formed by the functions furnished to the amplitude detection portion 51, the amplitude control portion 12, and the amplitude conversion portion 13 provided to the amplitude control unit 41, and the power supply control means is formed by the functions furnished to the amplitude detection portion 51 and the power supply control portion 52 provided to the power supply control unit 42 (the function furnished to the PA power supply portion 8 may be further included).

Also, in the amplifying device of this embodiment shown in FIG. 7, the gain detection means is formed by the function furnished to the gain detection portion 33 and the update means is formed by the function furnished to the device control portion 34.

Fourth Embodiment

A fourth embodiment will be described.

Figure 8:
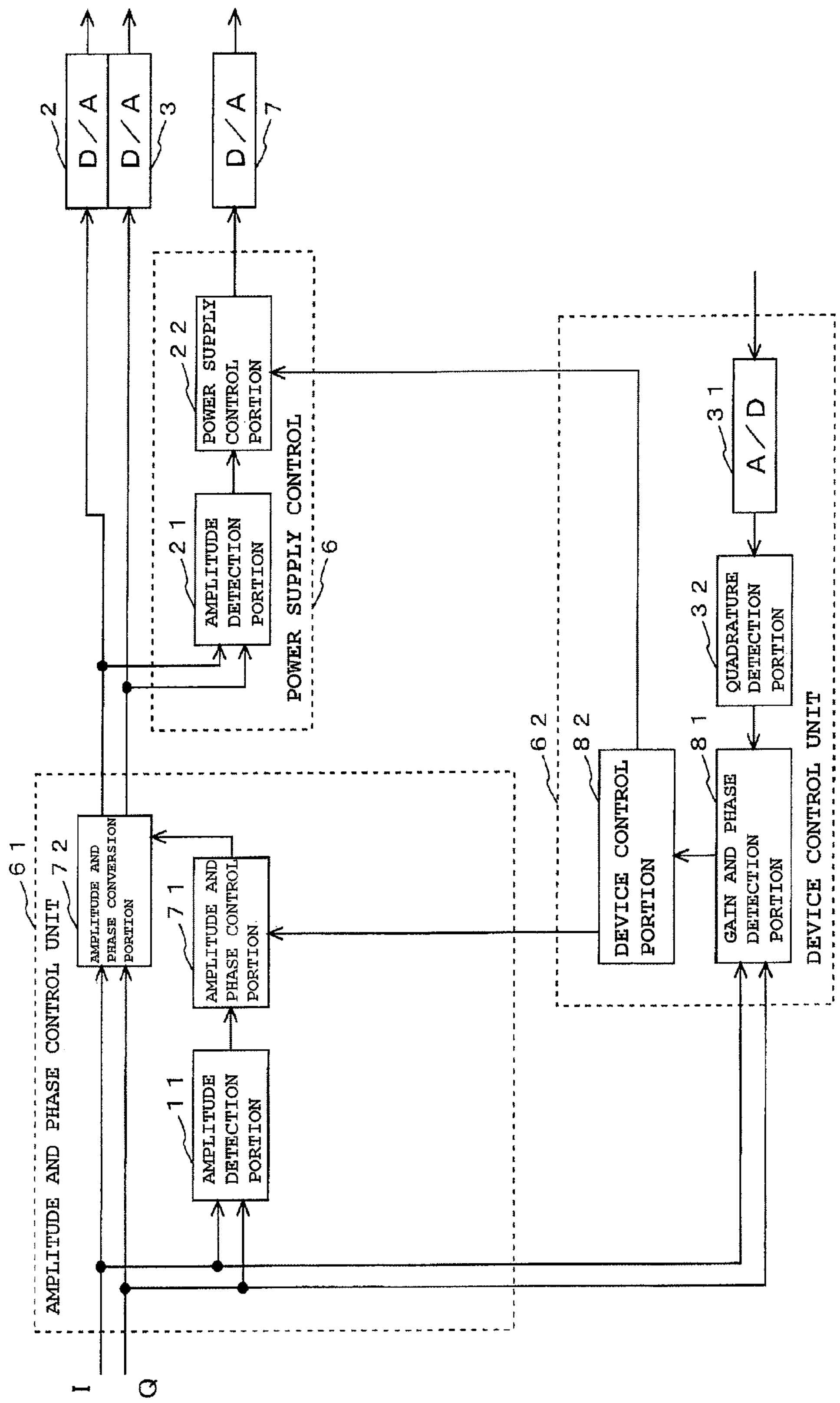
FIG. 8 is a view showing a configuration example of an amplifying device according to a fourth embodiment of the invention.
Figure 9:
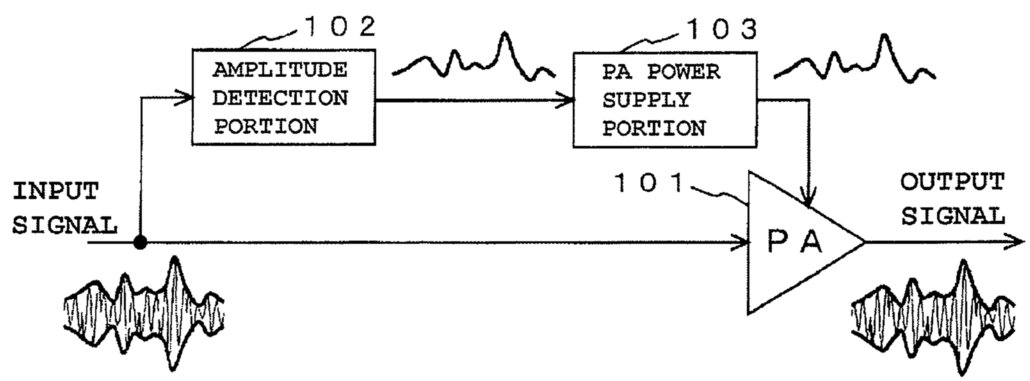
FIG. 9 is a view showing a configuration example of an amplifying device using the ET method.
Figure 10:
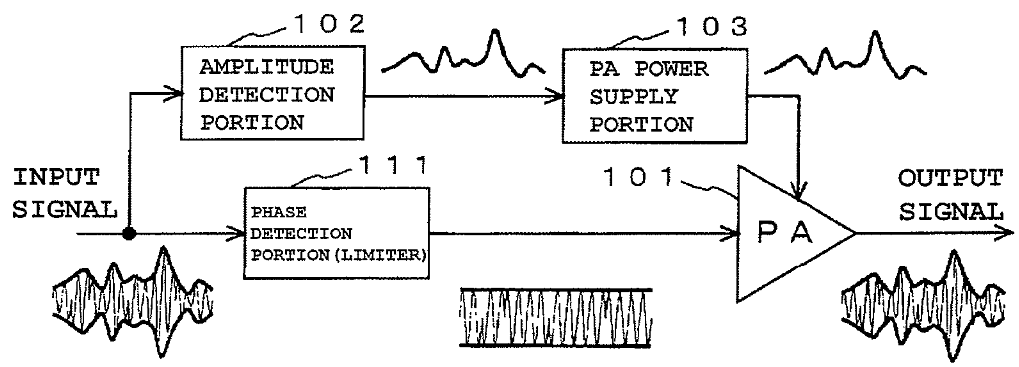
FIG. 10 is a view showing a configuration example of an amplifying device using the EER method.
Figure 11:
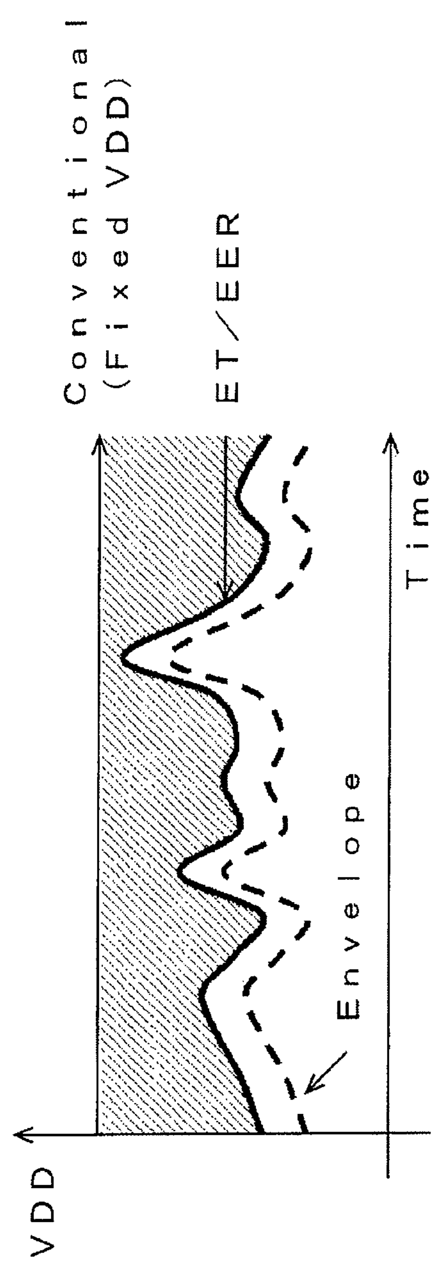
FIG. 11 is a view showing comparative examples to compare a conventional method (fixed voltage) with the ET method and the EER method.

FIG. 8 shows a configuration example of an amplifying device according to still another embodiment of the invention.

A configuration and an operation of the amplifying device of this embodiment are the same as those of the amplifying device shown in FIG. 5 except for differences from the amplifying device shown in FIG. 5 that the amplifying device of this embodiment includes an amplitude and phase control unit 61 instead of the amplitude control unit 1 shown in FIG. 5 and a device control unit 62 furnished with a function different from that furnished to the device control unit 9 shown in FIG. 5.

In short, the amplifying device of this embodiment is of a configuration in which a function of making a transient phase constant is additionally furnished to the amplifying device shown in FIG. 5.

The amplitude and phase control unit 61 of this embodiment includes an amplitude detection portion 11, an amplitude and phase control portion 71, and an amplitude and phase conversion portion 72.

The device control unit 62 of this embodiment includes an A-to-D converter 31, a quadrature detection portion 32, a gain and phase detection portion 81, and a device control portion 82.

Schematic configurations and operations of the amplitude detection portion 11 of the amplitude and phase control unit 61 (herein, an output destination is the amplitude and phase control portion 71), the A-to-D converter 31 and the quadrature detection portion 32 of the device control unit 61 (herein, an output destination is the gain and phase detection portion 81) are the same as those in the amplifying device shown in FIG. 5.

An example of an operation performed in the amplifying device of this embodiment will be described. Herein, a difference from the amplifying device shown in FIG. 5 will be described.

The amplitude and phase control portion 71 holds information on the amplitude converting value as shown in FIG. 3 and outputs an amplitude converting value corresponding to the instantaneous amplitude Env(t) detected by the amplitude detection portion 11 to the amplitude and phase conversion portion 72. Besides this function, the amplitude and phase control portion 71 holds the mapping between an input amplitude (or input power) and a phase converting value stored in a memory as information on the phase converting value, and outputs the phase converting value corresponding to the instantaneous amplitude Env(t) detected by the amplitude detection portion 11 to the amplitude and phase conversion portion 72.

The amplitude and phase conversion portion 72 converts the amplitudes and the phases of the input signals I(t) and Q(t) according to the amplitude converting value and the phase converting value, respectively, inputted therein from the amplitude and phase control portion 71 and outputs the signals after conversion to the D-to-A converters 2 and 3 and to the amplitude detection portion 21 of the power supply control unit 6.

As a manner in which to convert the amplitudes and the phases of the input signals I(t) and Q(t) according to the amplitude converting value and the phase converting value, respectively, in the amplitude and phase conversion portion 72, this embodiment adopts a manner in which the input signals I(t) and Q(t) are complex-multiplied by a complex signal exhibiting the amplitude converting value and the phase converting value. As an example, a complex multiplier is provided and the input signals are multiplied by a complex signal exhibiting the amplitude converting value and the phase converting value.

Into the gain and the phase detection portion 81 are inputted not only input signals into the amplifying device but also a signal on the feedback side from the quadrature detection portion 32.

The gain and phase detection portion 81 is furnished with a function of detecting the instantaneous amplitude Env(t) of input signals into the amplifying device in accordance, for example, with (Equation 1) above and a function of detecting an instantaneous amplitude FB(t) of a signal (signal from the feedback side) inputted therein from the quadrature detection portion 32 in accordance, for example, with (Equation 1) above.

Also, the gain and phase detection portion 81 detects a gain Gain(Env(t)) for every instantaneous amplitude Env(t) of the input signals into the amplifying device in accordance with (Equation 5) above on the basis of the instantaneous amplitude Env(t) of the input signals and the instantaneous amplitude FB(t) of a signal on the feedback side, and outputs the result to the device control portion 82.

Besides these functions, the gain and phase detection portion 81 detects information on the phase (for example, information on a phase difference between input signals into the amplifying device and a feedback signal) on the basis of input signals into the amplifying device and a signal on the feedback side from the quadrature detection portion 32, and outputs the result to the device control portion 82.

In this embodiment, the device control portion 82 adaptively controls the mappings (the mapping referring to the amplitude converting value and the mapping referring to the phase converting value) held in the amplitude and phase control portion 71 of the amplitude and phase control unit 61 and the mapping held in the power supply control portion 22 of the power supply control unit 6 on the basis of the information on the gain and information on the phase notified from the gain and phase detection portion 81, so that gain Gain(Env (t)) becomes constant and the transient phase becomes constant.

Regarding the phase, it is sufficient, for example, to adaptively control only the mapping (the mapping referring to the phase converting value) held in the amplitude and phase control portion 71 of the amplitude and phase control unit 61.

Conversion of the amplitude and the phase will now be described.

As an example, the amplitude and phase conversion portion 72 includes a complex multiplier and multiplies input signals by a signal made up of amplitude and phase converting values $G\theta_I$(Env(t)) and $G\theta_Q$(Env(t)) as expressed by (Equation 6) as follows:

[Formula 6]

$$(I'(t)+jQ'(t))=(I(t)+jQ(t))\cdot(G\theta_I(Env(t))+jG\theta_Q(Env(t))) \quad \text{(Equation 6).}$$

In (Equation 6) above, I'(t) and Q'(t) denote output signals from the amplitude and phase conversion portion 72, I(t) and Q(t) denote input signals into the amplitude and phase conversion portion 72, and j denotes an imaginary number.

Also, $G\theta_I$(Env(t)) and $G\theta_Q$(Env(t)) are functions of an output signal Env(t) from the amplitude detection portion 11, and relations expressed by (Equation 7) and (Equation 8) below are established.

[Formula 7]

$$G\theta_Q(Env(t))=\text{Gain}'(Env(t))\cdot\theta_I(Env(t)) \quad \text{(Equation 7)}$$

[Formula 8]

$$G\theta_Q(Env(t))=\text{Gain}'(Env(t))\cdot\theta_Q(Env(t)) \quad \text{(Equation 8)}$$

In (Equation 7) and (Equation 8) above, Gain'(Env(t)) denotes the amplitude converting value and $\theta_I$(Env(t)) and $\theta_Q$(Env(t)) denote the phase converting values.

The gain and phase detection portion 81 finds the mapping of the phase converting value in accordance with (Equation 9) below using the results $I_{FB}$(t) and $Q_{FB}$(t) obtained by applying quadrature detection to the feedback signal and outputs the result to the device control portion 82.

[Formula 9]

$$(\theta_1(Env(t))+j\theta_Q(Env(t)))=(I(t)+jQ(t))\cdot(I_{FB}(t)+jQ_{FB}(t))^*/|(I(t)+jQ(t))\cdot(I_{FB}(t)+jQ_{FB}(t))^*| \quad \text{(Equation 9)}$$

In (Equation 9), ( )* denotes a conjugate complex and || denotes a scalar of the amplitude, both of which are elements necessary to satisfy (Equation 10) as follows:

[Formula 10]

$$\theta_I(Env(t))^2+\theta_Q(Env(t))^2=1 \quad \text{(Equation 10).}$$

Other methods may be used as the method of finding information on the phase converting value as expressed by the left side of (Equation 9) above. A method as follows may be used as one example of the other methods. That is, a phase is found for each of an input signal and a signal on the feedback side in the same manner as (Equation 2) above. A difference between the phase of the input signal and the phase of the signal on the feedback side found as above is computed. Then, given $A_{FIX}=1$ in (Equation 3) and (Equation 4) above, information on the phase converting value (herein, $I'(t)=\theta_I$ and $Q'(t)=\theta_Q$) is found using the phase difference described above as θ(t).

Alternatively, a configuration method same as the one shown in FIG. 7 may be applied to the configuration of this embodiment shown in FIG. 8, so that the amplitude detection portion 11 of the amplitude and phase control unit 61 and the amplitude detection portion 21 of the power supply control unit 6 are provided in common.

As has been described, the amplifying device of this embodiment includes the amplitude detection portion 11 that detects an amplitude of an input signal, the amplitude and phase control portion 71 that outputs an amplitude converting value and a phase converting value corresponding to the detected amplitude, the amplitude and phase conversion portion 72 that converts the amplitude and the phase of the input signal according to the amplitude converting value and the phase converting value, respectively, the amplitude detection portion 21 that detects an amplitude of an output signal from the amplitude and phase conversion portion 72, the power supply control portion 22 that outputs a power supply control value corresponding to the detected amplitude, the A-to-D converter 31 that converts a feedback signal from the amplifier (PA 5) to a digital signal, the quadrature detection portion 32 that applies quadrature detection to the converted digital signal, the gain and phase detection portion 81 that detects information on a gain and a phase of the amplifying device on the basis of the input signal and the signal on the feedback side, and the device control portion 82 that updates at least one of the mapping in the amplitude and phase control portion 71 and the mapping in the power supply control portion 22.

Hence, in the amplifying device of this embodiment, it is possible to make the transient phase of the amplifying device constant.

It should be noted that the amplitude and phase control unit 61 of this embodiment may be interrupted as being furnished with a function same as a digital predistorter, so that, for example, a phase distortion can be reduced.

In the amplifying device of this embodiment shown in FIG. 8, the level control means (and means for controlling a phase herein) is formed by the functions furnished to the amplitude detection portion 11, the amplitude and phase control portion 71, and the amplitude and phase conversion portion 72 provided to the amplitude and phase control unit 61, and the power supply control means is formed by the functions furnished to the amplitude detection portion 21 and the power supply control portion 22 provided to the power supply control unit 6 (the function furnished to the PA power supply portion 8 may be further included).

Also, in the amplifying device of this embodiment shown in FIG. 8, the gain detection means (and means for detecting information on a phase herein) is formed by the function furnished to the gain and phase detection portion 81, and the update means (including also means for making an update relating to the phase converting value herein) is formed by the function furnished to the device control portion 82.

It should be appreciated that the configurations of the system and the device of the invention are not necessarily limited to those described above and various other configurations may be used instead. Also, the invention can be provided in the forms of a method or a scheme for performing the processing of the invention, a program run to achieve such a method and scheme, a recording medium having recorded the program. Further, the invention can be provided in the form of various systems and devices.

Also, applicable fields of the invention are not necessarily limited to those described above and the invention is applicable to various fields as well.

Also, as various types of processing performed by the system and the device of the invention, for example, it may be configured in such a manner that processing is controlled by running a control program stored in a ROM (Read Only Memory) on a processor in a hardware resource provided with the processor and the memory. Further, the respective functional means for performing the respective types processing may be formed as independent hardware circuits.

In addition, the invention can be understood as a computer-readable recording medium, such as a floppy (registered trademark) disk and a CD (Compact Disc)-ROM, having stored the control program described above or the program (itself). Hence, by installing the control program from the recording medium to a computer and allowing a processor to run the control program, it becomes possible to perform the processing of the invention.

REFERENCE SIGNS LIST

1 and 41: amplitude control unit
2, 3, 7, 122, 123, and 127: Digital-to-Analog converter
4 and 124: quadrature modulation portion
5, 101, and 125: power amplification portion (PA)
6 and 42: power supply control unit
8, 103, and 128: PA power supply portion
9 and 62: device control unit
11, 21, 51, 102, and 126: amplitude detection portion
12: amplitude control portion
13: amplitude conversion portion
22 and 52: power supply control portion
31: Analog-to-Digital converter
32: quadrature detection portion
33: gain detection portion
34 and 82: device control portion
61: amplitude and phase control unit
71: amplitude and phase control portion
72: amplitude and phase conversion portion
81: gain and phase detection portion
111 and 121: phase detection portion

The invention claimed is:

1. An amplifying device that amplifies a signal subject to amplification, the amplifying device comprising:

an amplifier that amplifies a signal;

a power supply portion of the amplifier;

a level detection portion that detects a level of the signal subject to amplification;

an amplitude control portion that converts an amplitude of the signal subject to amplification to an amplitude mapped to the level of the signal detected in the level detection portion; and a power supply control portion that controls a power supply voltage of the power supply portion to be a power supply voltage mapped to the level of the signal detected in the level detection portion, wherein the amplifier amplifies the signal having the amplitude converted by the amplitude control portion, the amplifying device further comprises:

a gain detection portion that detects a gain of the amplifying device at every level of the signal subject to amplification on the basis of the signal subject to amplification and a signal outputted from the amplifier; and an update processing portion that updates mapping by which to convert the amplitude of the signal subject to amplification in the amplitude control portion and mapping by which to control the power supply voltage in the power supply control portion at every level of the signal subject to amplification so that the gain of the amplifying device becomes closer to a target gain, the update control portion compares the gain at every level of the signal subject to amplification detected by the gain detection portion with the target gain, in a case where the detected gain is higher than the target gain, processing to update the mapping by which to control the power supply voltage in the power supply control portion in a direction to lower the power supply voltage is performed with a higher priority than processing to update the mapping by which to convert the amplitude of the signal subject to amplification in the amplitude control portion, and in a case where the detected gain is lower than the target gain, processing to update the mapping by which to convert the amplitude of the signal subject to amplification in the amplitude control portion in a direction to increase the amplitude of the signal subject to amplification is performed with a higher priority than processing to update the mapping by which to control the power supply voltage in the power supply control portion.

2. An amplifying device that amplifies a signal subject to amplification, the amplifying device comprising:

an amplifier that amplifies a signal;

a power supply portion of the amplifier;

a level detection portion that detects a level of the signal subject to amplification;

an amplitude control portion that converts an amplitude of the signal subject to amplification to an amplitude mapped to the level of the signal detected in the level detection portion; and a power supply control portion that controls a power supply voltage of the power supply portion to be a power supply voltage mapped to the level of the signal detected in the level detection portion, wherein the amplifier amplifies the signal having the amplitude converted by the amplitude control portion, the amplitude control portion includes a storage portion that stores a table or a mathematical formula that maps a level of the signal subject to amplification detected in the level detection portion to an amplitude converting value used when the amplitude of the signal at the detected level is converted, and the power supply control portion includes a storage portion that stores a table or a mathematical formula that maps a level of the signal subject to amplification detected in the level detection portion to a power supply control value used when the power supply voltage is controlled.

3. The amplifying device according to claim 2, wherein the storage portion of the amplitude control portion stores the mapping so that the gain of the amplifying device remains constant independently of the level of the signal subject to amplification, and the storage portion of the power supply control portion stores the mapping so that power efficiency of the amplifier reaches a maximum for the level of the signal subject to amplification.

4. The amplifying device according to claim 2, wherein the amplifying device further comprises:

a gain detection portion that detects a gain of the amplifying device at every level of the signal subject to amplification on the basis of the signal subject to amplification and a signal outputted from the amplifier; and an update processing portion that updates mapping of the amplitude control value stored in the storage portion of the amplitude control portion and mapping of the power supply control value stored in the storage portion of the power supply control portion at every level of the signal subject to amplification so that the gain of the amplifying device becomes closer to a target gain, the update control portion compares the gain at every level of the signal subject to amplification detected by the gain detection portion with the target gain, in a case where the detected gain is higher than the target gain, processing to update the mapping stored in the storage portion of the power supply control portion in a direction to lower the power supply voltage of the power supply portion is performed with a higher priority than processing to update the mapping stored in the storage portion of the amplitude control portion, and in a case where the detected gain is lower than the target gain, processing to update the mapping stored in the storage portion of the amplitude control portion in a direction to increase the amplitude of the signal subject to amplification is performed with a higher priority than processing to update the mapping stored in the storage portion of the power supply control portion.

5. An amplifying device that amplifies a signal subject to amplification, the amplifying device comprising:

an amplifier that amplifies a signal;

a power supply portion of the amplifier;

an amplitude control portion that converts an amplitude of the signal subject to amplification to an amplitude mapped to a level of the signal and outputs the converted signal to the amplifier;

a power supply control portion that controls a power supply voltage of the power supply portion to be a power supply voltage mapped to the level of the signal having the amplitude converted in the amplitude control portion;

a gain detection portion that detects a gain of the amplifying device at every level of the signal subject to amplification on the basis of the signal subject to amplification and a signal outputted from the amplifier; and an update processing portion that updates mapping by which to convert the amplitude of the signal subject to amplification in the amplitude control portion and mapping by which to control the power supply voltage in the power supply control portion at every level of the signal subject to amplification so that the gain of the amplifying device becomes closer to a target gain, wherein the update control portion compares the gain at every level of the signal subject to amplification detected by the gain detection portion with the target gain, in a case where the detected gain is higher than the target gain, processing to update the mapping by which to control the power supply voltage in the power supply control portion in a direction to lower the power supply voltage is performed with a higher priority than processing to update the mapping by which to convert the amplitude of the signal subject to amplification in the amplitude control portion, and in a case where the detected gain is lower than the target gain, processing to update the mapping by which to convert the amplitude of the signal subject to amplification in the amplitude control portion in a direction to increase the amplitude of the signal subject to amplification is performed with a higher priority than processing to update the mapping by which to control the power supply voltage in the power supply control portion.

6. The amplifying device according to claim 5, wherein the amplitude control portion includes a storage portion that stores a table or a mathematical formula that maps a level of the signal subject to amplification to an amplitude converting value used when the amplitude of the signal at the detected level is converted, and the power supply control portion includes a storage portion that stores a table or a mathematical formula that maps a level of the signal having the amplitude converted in the amplitude control portion to a power supply control value used when the power supply voltage is controlled.

* * * * *